(12) United States Patent
Raad et al.

(10) Patent No.: US 10,818,343 B2
(45) Date of Patent: Oct. 27, 2020

(54) TECHNIQUES FOR CHARGING A SENSE COMPONENT

(71) Applicant: Micron Technology, Inc., Boise, ID (US)

(72) Inventors: George B. Raad, Boise, ID (US); John F. Schreck, Lucas, TX (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/232,327

(22) Filed: Dec. 26, 2018

(65) Prior Publication Data
US 2020/0211623 A1    Jul. 2, 2020

(51) Int. Cl.
| | | |
|---|---|---|
| *G11C 11/40* | (2006.01) | |
| *G11C 11/4091* | (2006.01) | |
| *G11C 11/4074* | (2006.01) | |
| *G11C 7/06* | (2006.01) | |
| *G11C 16/26* | (2006.01) | |
| *G11C 16/04* | (2006.01) | |
| *G11C 7/12* | (2006.01) | |

(52) U.S. Cl.
CPC .......... *G11C 11/4091* (2013.01); *G11C 7/065* (2013.01); *G11C 7/12* (2013.01); *G11C 11/4074* (2013.01); *G11C 16/0483* (2013.01); *G11C 16/26* (2013.01); *G11C 2207/005* (2013.01)

(58) Field of Classification Search
CPC ....... G11C 11/4091; G11C 7/065; G11C 7/12; G11C 16/26
See application file for complete search history.

(56) References Cited

U.S. PATENT DOCUMENTS

| | | | | |
|---|---|---|---|---|
| 2015/0023108 A1* | 1/2015 | Kang | ................ | G11C 16/3459 365/185.21 |
| 2018/0061464 A1* | 3/2018 | Yamauchi | ................ | G11C 7/02 |
| 2019/0164581 A1* | 5/2019 | Nguyen | ................ | G11C 7/08 |

* cited by examiner

*Primary Examiner* — Han Yang
(74) *Attorney, Agent, or Firm* — Holland & Hart LLP

(57) ABSTRACT

Systems, devices, and methods for charging a node of a sense component during an access operation are described. The node of the sense component may be coupled with a charge transfer device and with a voltage source using a switching component. The voltage source may be configured to output different voltages (e.g., two different precharge voltages) during different phases of the access operation. The switching component may be configured to selectively couple the node with the voltage source and the different voltages may be used to precharge the node during different phases of the access operation. The different voltages of the voltage source may provide an adequate sense window.

20 Claims, 7 Drawing Sheets

TECHNIQUES FOR CHARGING A SENSE COMPONENT

BACKGROUND

The following relates generally to operating a memory device and more specifically to techniques for charging a sense component.

Memory devices are widely used to store information in various electronic devices such as computers, wireless communication devices, cameras, digital displays, and the like. Information is stored by programing different states of a memory device. For example, binary devices most often store one of two states, often denoted by a logic 1 or a logic 0. In other devices, more than two states may be stored. To access the stored information, a component of the electronic device may read, or sense, at least one stored state in the memory device. To store information, a component of the electronic device may write, or program, the state in the memory device.

Various types of memory devices exist, including magnetic hard disks, random access memory (RAM), read only memory (ROM), dynamic RAM (DRAM), synchronous dynamic RAM (SDRAM), ferroelectric RAM (FeRAM), magnetic RAM (MRAM), resistive RAM (RRAM), flash memory, phase change memory (PCM), and others. Memory devices may be volatile or non-volatile. Volatile memory devices, e.g., DRAM, may lose their stored state over time unless they are periodically refreshed by an external power source. Non-volatile memory, e.g., FeRAM, may maintain their stored logic state for extended periods of time even in the absence of an external power source.

Improving memory devices, generally, may include increasing memory cell density, increasing read/write speeds, increasing reliability, increasing data retention, reducing power consumption, or reducing manufacturing costs, among other metrics. Some memory cells may be configured to store multiple states. Improving an efficiency (e.g., less power consumption, improved sensing accuracy) of a sensing component of memory devices may also be desired.

DETAILED DESCRIPTION

Figure 1:
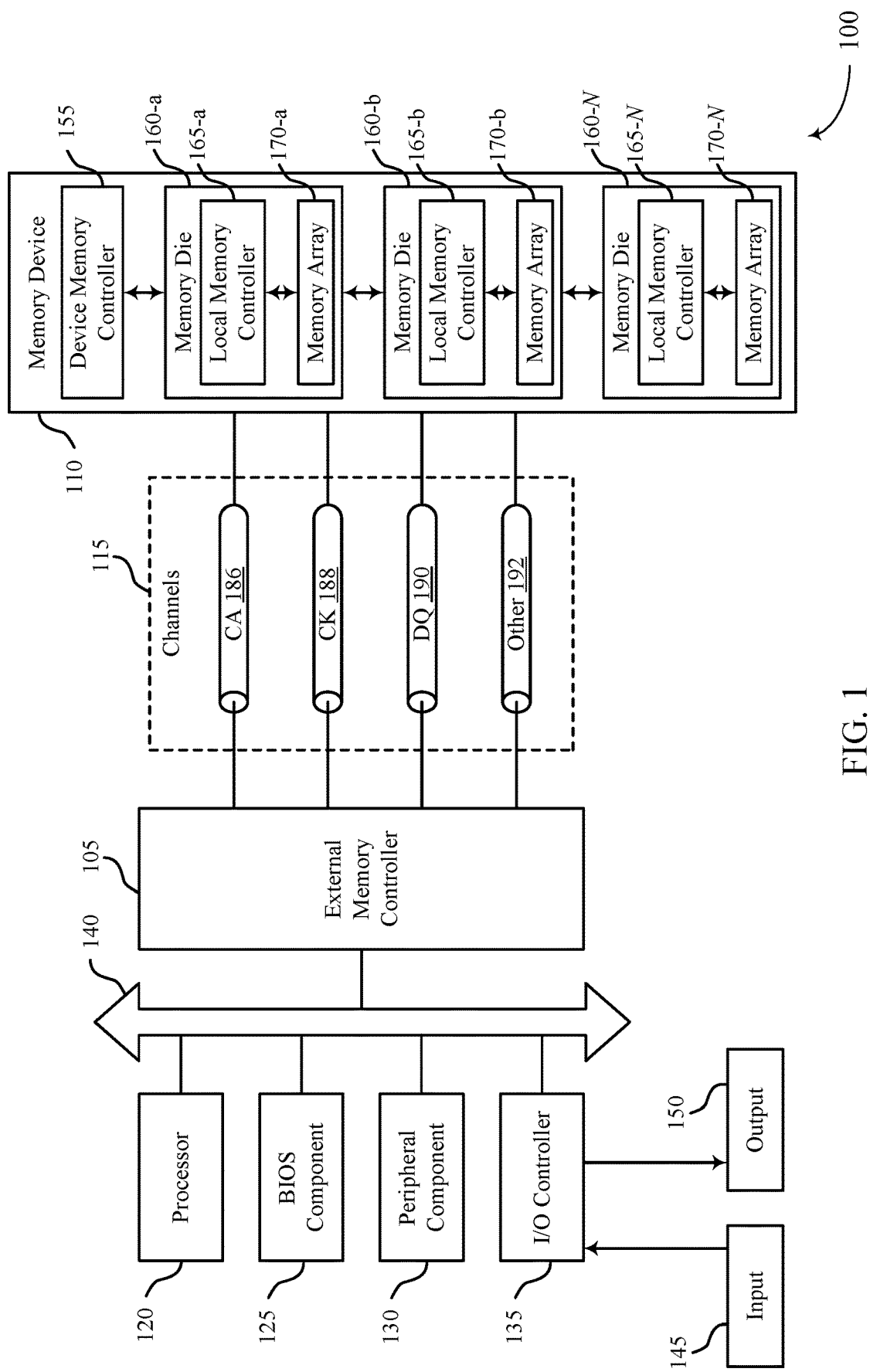
FIG. 1 illustrates an example of a system that supports techniques for charging a sense component in accordance with aspects of the present disclosure.

In some memory devices, a memory cell may be configured to store more than two states (e.g., more than one bit of digital data). Accurate sensing of the memory cell may become difficult as the memory cell scales to increase packing density or increasing a number of bits per memory cell (e.g., a multi-level cell). To improve the sensing of a multi-level memory cell during various phases of a read operation a node of a sense component may be precharged to different voltages. In some cases, modifying (e.g., tuning) the precharge voltages based on phases of the read operation may improve the read operation (e.g., reduced power consumption, increased sense window).

Techniques for charging a node of a sense component during a read operation are described. A node (e.g., a sense node) of the sense component may be selectively coupled with one or more voltage sources using one or more switching components (e.g., transistors) to be precharged during the read operation. The node of the sense component may be further coupled with a charge transfer device that may be configured to transfer a charge from a memory cell to the node and increase a sense window of the memory cell during the read operation. The sense component may be configured to determine a logic state stored on a memory cell based on a signal on the node during the read operation. The signal sensed on the node by the sense component during the read operation may be based on the precharge voltages applied to the node during the read operation.

In some cases, the node may be coupled to a single voltage source and the voltage source may be configured to output different voltages (e.g., at least two different precharge voltages) during different phases of the read operation. For example, the voltage source may output a first precharge voltage that may be high enough to bias a gate of the charge transfer device to a first voltage during a first duration of the read operation. The voltage source may output a second precharge voltage that may provide an adequate sense window for determining a logic state of the memory cell during a second duration of the read operation, which may be after the first duration of the read operation. In this manner, the output of the voltage source (e.g., the first precharge voltage and the second precharge voltage) may be modified (e.g., trimmed) independent of each other to provide voltages on the node that are tailored to a particular phase of the read operation. Further, the output of the voltage source may be modified (e.g., trimmed) during a testing stage such that the voltages may be configured to mitigate undesirable effects that may be introduced by fabrication process variations (e.g., transistor threshold voltage variations due to statistical fluctuations in process conditions, such as gate oxide thickness variations, implant dose variations, and the like).

In some cases, the node may be coupled to two or more voltage sources. In such cases, one or more switching components may be configured to selectively couple the node with the two or more voltage sources. For example, a transistor may be configured to selectively couple the node with a first voltage source during a first duration of a read operation and a second transistor may be configured to selectively couple the node with a second voltage source during a second duration of the read operation. In some instances, one of the voltage sources may also comprise an input/output (I/O) line.

A read operation may include at least two phases. During a first phase, a voltage may be applied to a gate of a charge transfer device and, during a second phase, a charge may be transferred between the node of the sense component and the digit line, where the charge may be indicative of a logic state stored on a memory cell. During the first phase of the read operation, a controller may charge the sense node of the sense component to a first precharge voltage. The sense node may be coupled with a charge transfer device (e.g., a first transistor) and a switching component (e.g., a second transistor), which may be configured to selectively couple the sense node with a voltage source. The controller may bias a gate of the first transistor to a first voltage based on charging the sense node to the first precharge voltage. Subsequently, during the second phase of the read operation, the controller may, using the switching component, charge the sense node to a second precharge voltage that is different than (e.g., greater than) the first precharge voltage. The controller may, using the charge transfer device, couple the sense node with a digit line associated with a memory cell such that a charge may be transferred between the digit line and the sense node. The controller may then determine a logic state stored on the memory cell based on transferring the charge between the digit line and the sense node (e.g., coupling the sense node with the digit line).

Features of the disclosure are initially described in the context of a memory system. Features of the disclosure are described in the context of a memory die, a circuit diagram, and a timing diagram that support techniques for charging a sense component in accordance with aspects of the present disclosure. These and other features of the disclosure are further illustrated by and described with reference to an apparatus diagram and flowcharts that relate to sensing techniques using a charge transfer device.

FIG. 1 illustrates an example of a system 100 that utilizes one or more memory devices in accordance with aspects disclosed herein. The system 100 may include an external memory controller 105, a memory device 110, and a plurality of channels 115 coupling the external memory controller 105 with the memory device 110. The system 100 may include one or more memory devices, but for ease of description the one or more memory devices may be described as a single memory device 110.

The system 100 may include aspects of an electronic device, such as a computing device, a mobile computing device, a wireless device, or a graphics processing device. The system 100 may be an example of a portable electronic device. The system 100 may be an example of a computer, a laptop computer, a tablet computer, a smartphone, a cellular phone, a wearable device, an internet-connected device, or the like. The memory device 110 may be a component configured to store data for one or more other components of the system 100. In some examples, the system 100 is configured for bi-directional wireless communication with other systems or devices using a base station or access point. In some examples, the system 100 is capable of machine-type communication (MTC), machine-to-machine (M2M) communication, or device-to-device (D2D) communication.

At least some portions of the system 100 may be examples of a host device. Such a host device may be an example of a device that uses memory to execute processes such as a computing device, a mobile computing device, a wireless device, a graphics processing device, a computer, a laptop computer, a tablet computer, a smartphone, a cellular phone, a wearable device, an internet-connected device, some other stationary or portable electronic device, or the like. In some cases, the host device may refer to the hardware, firmware, software, or a combination thereof that implements the functions of the external memory controller 105. In some cases, the external memory controller 105 may be referred to as a host or host device.

In some cases, a memory device 110 may be an independent device or component that is configured to be in communication with other components of the system 100 and provide physical memory addresses/space to potentially be used or referenced by the system 100. In some examples, a memory device 110 may be configurable to work with at least one or a plurality of different types of systems 100. Signaling between the components of the system 100 and the memory device 110 may be operable to support modulation schemes to modulate the signals, different pin designs for communicating the signals, distinct packaging of the system 100 and the memory device 110, clock signaling and synchronization between the system 100 and the memory device 110, timing conventions, and/or other factors.

The memory device 110 may be configured to store data for the components of the system 100. In some cases, the memory device 110 may act as a slave-type device to the system 100 (e.g., responding to and executing commands provided by the system 100 through the external memory controller 105). Such commands may include an access command for an access operation, such as a write command for a write operation, a read command for a read operation, a refresh command for a refresh operation, or other commands. The memory device 110 may include two or more memory dice 160 (e.g., memory chips) to support a desired or specified capacity for data storage. The memory device 110 including two or more memory dice may be referred to as a multi-die memory or package (also referred to as multi-chip memory or package).

The system 100 may further include a processor 120, a basic I/O system (BIOS) component 125, one or more peripheral components 130, and an I/O controller 135. The components of system 100 may be in electronic communication with one another using a bus 140.

The processor 120 may be configured to control at least portions of the system 100. The processor 120 may be a general-purpose processor, a digital signal processor (DSP), an application-specific integrated circuit (ASIC), a field-programmable gate array (FPGA) or other programmable logic device, discrete gate or transistor logic, discrete hardware components, or it may be a combination of these types of components. In such cases, the processor 120 may be an example of a central processing unit (CPU), a graphics processing unit (GPU), or a system on a chip (SoC), among other examples.

The BIOS component 125 may be a software component that includes a BIOS operated as firmware, which may initialize and run various hardware components of the system 100. The BIOS component 125 may also manage data flow between the processor 120 and the various components of the system 100, e.g., the peripheral components 130, the I/O controller 135. The BIOS component 125 may include a program or software stored in read-only memory (ROM), flash memory, or any other non-volatile memory.

The peripheral component(s) 130 may be any input device or output device, or an interface for such devices, that may be integrated into or with the system 100. Examples may include disk controllers, sound controller, graphics controller, Ethernet controller, modem, universal serial bus (USB) controller, a serial or parallel port, or peripheral card slots, such as peripheral component interconnect (PCI) or accelerated graphics port (AGP) slots. The peripheral component(s) 130 may be other components understood by those skilled in the art as peripherals.

The I/O controller 135 may manage data communication between the processor 120 and the peripheral component(s) 130, input devices 145, or output devices 150. The I/O controller 135 may manage peripherals that are not integrated into or with the system 100. In some cases, the I/O controller 135 may represent a physical connection or port to external peripheral components.

The input 145 may represent a device or signal external to the system 100 that provides information, signals, or data to the system 100 or its components. This may include a user interface or interface with or between other devices. In some cases, the input 145 may be a peripheral that interfaces with system 100 via one or more peripheral components 130 or may be managed by the I/O controller 135.

The output 150 may represent a device or signal external to the system 100 configured to receive an output from the system 100 or any of its components. Examples of the output 150 may include a display, audio speakers, a printing device, or another processor on printed circuit board, etc. In some cases, the output 150 may be a peripheral that interfaces with the system 100 via one or more peripheral components 130 or may be managed by the I/O controller 135.

The components of system 100 may be made up of general-purpose or special purpose circuitry designed to carry out their functions. This may include various circuit elements, for example, conductive lines, transistors, capacitors, inductors, resistors, amplifiers, or other active or passive elements, configured to carry out the functions described herein.

The memory device 110 may include a device memory controller 155 and one or more memory dice 160. Each memory die 160 may include a local memory controller 165 (e.g., local memory controller 165-a, local memory controller 165-b, and/or local memory controller 165-N) and a memory array 170 (e.g., memory array 170-a, memory array 170-b, and/or memory array 170-N). A memory array 170 may be a collection (e.g., a grid) of memory cells, with each memory cell being configured to store at least one bit of digital data. Features of memory arrays 170 and/or memory cells are described in more detail with reference to FIG. 2.

In some examples, the memory device 110 or the memory die 160 may be coupled with or include a sense component. Each memory cell of memory array 170, for example, may be coupled with a digit line that may be further coupled with a charge transfer device (e.g., a first transistor). The charge transfer device may be configured to transfer a charge between the digit line and a sense node of the sense component based on the memory cell being discharged onto the digit line. The sense node of the sense components may be coupled with a voltage source through a switching component (e.g., a second transistor) that may be configured to selectively couple the sense component with the voltage source. The voltage source may be configured to precharge the sense component to a first precharge voltage during a first duration of the read operation and to a second precharge voltage during a second duration of the read operation. The switching component may be configured to selectively couple the node with the voltage source and thereby apply the first precharge voltage and the second precharge voltage to a node of the charge transfer device during the read operation.

The memory device 110 may be an example of a two-dimensional (2D) array of memory cells or may be an example of a three-dimensional (3D) array of memory cells. For example, a 2D memory device may include a single memory die 160. A 3D memory device may include two or more memory dice 160 (e.g., memory die 160-a, memory die 160-b, and/or any number of memory dice 160-N). In a 3D memory device, a plurality of memory dice 160-N may be stacked on top of one another. In some cases, memory dice 160-N in a 3D memory device may be referred to as decks, levels, layers, or dies. A 3D memory device may include any quantity of stacked memory dice 160-N (e.g., two high, three high, four high, five high, six high, seven high, eight high). This may increase the number of memory cells that may be positioned on a substrate as compared with a single 2D memory device, which in turn may reduce production costs or increase the performance of the memory array, or both.

The device memory controller 155 may include circuits or components configured to control operation of the memory device 110. As such, the device memory controller 155 may include the hardware, firmware, and software that enables the memory device 110 to perform commands and may be configured to receive, transmit, or execute commands, data, or control information related to the memory device 110. The device memory controller 155 may be configured to communicate with the external memory controller 105, the one or more memory dice 160, or the processor 120.

In some cases, the memory device 110 may receive data and/or commands from the external memory controller 105. For example, the memory device 110 may receive a write command indicating that the memory device 110 is to store certain data on behalf of a component of the system 100 (e.g., the processor 120) or a read command indicating that the memory device 110 is to provide certain data stored in a memory die 160 to a component of the system 100 (e.g., the processor 120). In some cases, the device memory controller 155 may control operation of the memory device 110 described herein in conjunction with the local memory controller 165 of the memory die 160. Examples of the components included in the device memory controller 155 and/or the local memory controllers 165 may include receivers for demodulating signals received from the external memory controller 105, decoders for modulating and transmitting signals to the external memory controller 105, logic, decoders, amplifiers, filters, or the like.

During a read operation, the local memory controller 165 (or the device memory controller 155 in conjunction with the local memory controller 165) may charge a sense node of a sense component to a first precharge voltage. The sense node may be coupled with a charge transfer device (e.g., a first transistor) and a switching component (e.g., a second transistor), which may be configured to selectively couple the sense node with a voltage source. In some cases, the voltage source may be configured to output different voltages (e.g., at least two different precharge voltages) during different phases of the read operation. Further, the local memory controller 165 (or the device memory controller 155 in conjunction with the local memory controller 165) may bias a gate of the charge transfer device (e.g., the first transistor) to a first voltage based on charging the sense node to the first precharge voltage.

Subsequently, the local memory controller 165 (or the device memory controller 155 in conjunction with the local memory controller 165) may, using the switching component, charge the sense node to a second precharge voltage different than the first precharge voltage based on biasing the gate of the charge transfer device to the first voltage. The local memory controller 165 (or the device memory controller 155 in conjunction with the local memory controller 165) may couple the sense node with a digit line associated with a memory cell based on charging the sense node to the second precharge voltage. As a result, the local memory controller 165 (or the device memory controller 155 in conjunction with the local memory controller 165) may determine a logic state stored on the memory cell based on coupling the sense node with the digit line. The sense window of a memory cell during a read operation may be based on a magnitude of the second precharge voltage.

The local memory controller 165 (e.g., local to a memory die 160) may be configured to control operations of the memory die 160. Also, the local memory controller 165 may be configured to communicate (e.g., receive and transmit data and/or commands) with the device memory controller 155. The local memory controller 165 may support the device memory controller 155 to control operation of the memory device 110 described herein. In some cases, the memory device 110 does not include the device memory controller 155, and the local memory controller 165 or the external memory controller 105 may perform the various functions described herein. As such, the local memory controller 165 may be configured to communicate with the device memory controller 155, with other local memory controllers 165, or directly with the external memory controller 105 or the processor 120.

The external memory controller 105 may be configured to enable communication of information, data, and/or commands between components of the system 100 (e.g., the processor 120) and the memory device 110. The external memory controller 105 may act as a liaison between the components of the system 100 and the memory device 110 so that the components of the system 100 may not need to know the details of the memory device's operation. The components of the system 100 may present requests to the external memory controller 105 (e.g., read commands or write commands) that the external memory controller 105 satisfies. The external memory controller 105 may convert or translate communications exchanged between the components of the system 100 and the memory device 110. In some cases, the external memory controller 105 may include a system clock that generates a common (source) system clock signal. In some cases, the external memory controller 105 may include a common data clock that generates a common (source) data clock signal.

In some cases, the external memory controller 105 or other component of the system 100, or its functions described herein, may be implemented by the processor 120. For example, the external memory controller 105 may be hardware, firmware, or software, or some combination thereof implemented by the processor 120 or other component of the system 100. While the external memory controller 105 is depicted as being external to the memory device 110, in some cases, the external memory controller 105, or its functions described herein, may be implemented by a memory device 110. For example, the external memory controller 105 may be hardware, firmware, or software, or some combination thereof implemented by the device memory controller 155 or one or more local memory controllers 165. In some cases, the external memory controller 105 may be distributed across the processor 120 and the memory device 110 such that portions of the external memory controller 105 are implemented by the processor 120 and other portions are implemented by a device memory controller 155 or a local memory controller 165. Likewise, in some cases, one or more functions ascribed herein to the device memory controller 155 or local memory controller 165 may in some cases be performed by the external memory controller 105 (either separate from or as included in the processor 120).

The components of the system 100 may exchange information with the memory device 110 using a plurality of channels 115. In some examples, the channels 115 may enable communications between the external memory controller 105 and the memory device 110. Each channel 115 may include one or more signal paths or transmission mediums (e.g., conductors) between terminals associated with the components of system 100. For example, a channel 115 may include a first terminal including one or more pins or pads at external memory controller 105 and one or more pins or pads at the memory device 110. A pin may be an example of a conductive input or output point of a device of the system 100, and a pin may be configured to act as part of a channel. In some cases, a pin or pad of a terminal may be part of a signal path of the channel 115.

Additional signal paths may be coupled with a terminal of a channel for routing signals within a component of the system 100. For example, the memory device 110 may include signal paths (e.g., signal paths internal to the memory device 110 or its components, such as internal to a memory die 160) that route a signal from a terminal of a channel 115 to the various components of the memory device 110 (e.g., a device memory controller 155, memory dice 160, local memory controllers 165, memory arrays 170).

Channels 115 (and associated signal paths and terminals) may be dedicated to communicating specific types of information. In some cases, a channel 115 may be an aggregated channel and thus may include multiple individual channels. For example, a data (DQ) channel 190 may be x4 (e.g., including four signal paths), x8 (e.g., including eight signal paths), x16 (including sixteen signal paths), etc.

In some cases, the channels 115 may include one or more command and address (CA) channels 186. The CA channels 186 may be configured to communicate commands between the external memory controller 105 and the memory device 110 including control information associated with the commands (e.g., address information). For example, the CA channel 186 may include a read command with an address of the desired data. In some cases, the CA channels 186 may be registered on a rising clock signal edge and/or a falling clock signal edge. In some cases, a CA channel 186 may include eight or nine signal paths.

In some cases, the channels 115 may include one or more clock signal (CK) channels 188. The CK channels 188 may be configured to communicate one or more common clock signals between the external memory controller 105 and the memory device 110. Each clock signal may be configured to oscillate between a high state and a low state and coordinate the actions of the external memory controller 105 and the memory device 110. In some cases, the clock signal may be a differential output (e.g., a CK_signal and a CK_c signal) and the signal paths of the CK channels 188 may be configured accordingly. In some cases, the clock signal may be single ended.

In some cases, the clock signal may be a 1.5 GHz signal. A CK channel 188 may include any number of signal paths. In some cases, the clock signal CK (e.g., a CK_t signal and a CK_c signal) may provide a timing reference for command and addressing operations for the memory device 110, or other system-wide operations for the memory device 110. The clock signal CK may therefore may be variously referred to as a control clock signal CK, a command clock signal CK, or a system clock signal CK. The system clock signal CK may be generated by a system clock, which may include one or more hardware components (e.g., oscillators, crystals, logic gates, transistors, or the like).

In some cases, the channels 115 may include one or more data (DQ) channels 190. The data channels 190 may be configured to communicate data and/or control information between the external memory controller 105 and the memory device 110. For example, the data channels 190 may communicate (e.g., bi-directional) information to be written to the memory device 110 or information read from the memory device 110. The data channels 190 may communicate signals that may be modulated using a variety of different modulation schemes (e.g., NRZ, PAM4).

In some cases, the channels 115 may include one or more other channels 192 that may be dedicated to other purposes. These other channels 192 may include any number of signal paths.

In some cases, the other channels 192 may include one or more write clock signal (WCK) channels. While the 'W' in WCK may nominally stand for "write," a write clock signal WCK (e.g., a WCK_t signal and a WCK_c signal) may provide a timing reference for access operations generally for the memory device 110 (e.g., a timing reference for both read and write operations). Accordingly, the write clock signal WCK may also be referred to as a data clock signal WCK. The WCK channels may be configured to communicate a common data clock signal between the external memory controller 105 and the memory device 110. The data clock signal may be configured to coordinate an access operation (e.g., a write operation or read operation) of the external memory controller 105 and the memory device 110. In some cases, the write clock signal may be a differential output (e.g., a WCK_t signal and a WCK_c signal) and the signal paths of the WCK channels may be configured accordingly. A WCK channel may include any number of signal paths. The data clock signal WCK may be generated by a data clock, which may include one or more hardware components (e.g., oscillators, crystals, logic gates, transistors, or the like).

In some cases, the other channels 192 may, optionally, include one or more error detection code (EDC) channels. The EDC channels may be configured to communicate error detection signals, such as checksums, to improve system reliability. An EDC channel may include any number of signal paths.

The channels 115 may couple the external memory controller 105 with the memory device 110 using a variety of different architectures. Examples of the various architectures may include a bus, a point-to-point connection, a crossbar, a high-density interposer such as a silicon interposer, or channels formed in an organic substrate or some combination thereof. For example, in some cases, the signal paths may at least partially include a high-density interposer, such as a silicon interposer or a glass interposer.

Signals communicated over the channels 115 may be modulated using a variety of different modulation schemes. In some cases, a binary-symbol (or binary-level) modulation scheme may be used to modulate signals communicated between the external memory controller 105 and the memory device 110. A binary-symbol modulation scheme may be an example of a M-ary modulation scheme where M is equal to two. Each symbol of a binary-symbol modulation scheme may be configured to represent one bit of digital data (e.g., a symbol may represent a logic 1 or a logic 0). Examples of binary-symbol modulation schemes include, but are not limited to, non-return-to-zero (NRZ), unipolar encoding, bipolar encoding, Manchester encoding, pulse amplitude modulation (PAM) having two symbols (e.g., PAM2), and/or others.

In some cases, a multi-symbol (or multi-level) modulation scheme may be used to modulate signals communicated between the external memory controller 105 and the memory device 110. A multi-symbol modulation scheme may be an example of a M-ary modulation scheme where M is greater than or equal to three. Each symbol of a multi-symbol modulation scheme may be configured to represent more than one bit of digital data (e.g., a symbol may represent a logic 00, a logic 01, a logic 10, or a logic 11). Examples of multi-symbol modulation schemes include, but are not limited to, PAM4, PAM8, etc., quadrature amplitude modulation (QAM), quadrature phase shift keying (QPSK), and/or others. A multi-symbol signal or a PAM4 signal may be a signal that is modulated using a modulation scheme that includes at least three levels to encode more than one bit of information. Multi-symbol modulation schemes and symbols may alternatively be referred to as non-binary, multi-bit, or higher-order modulation schemes and symbols.

Figure 2:
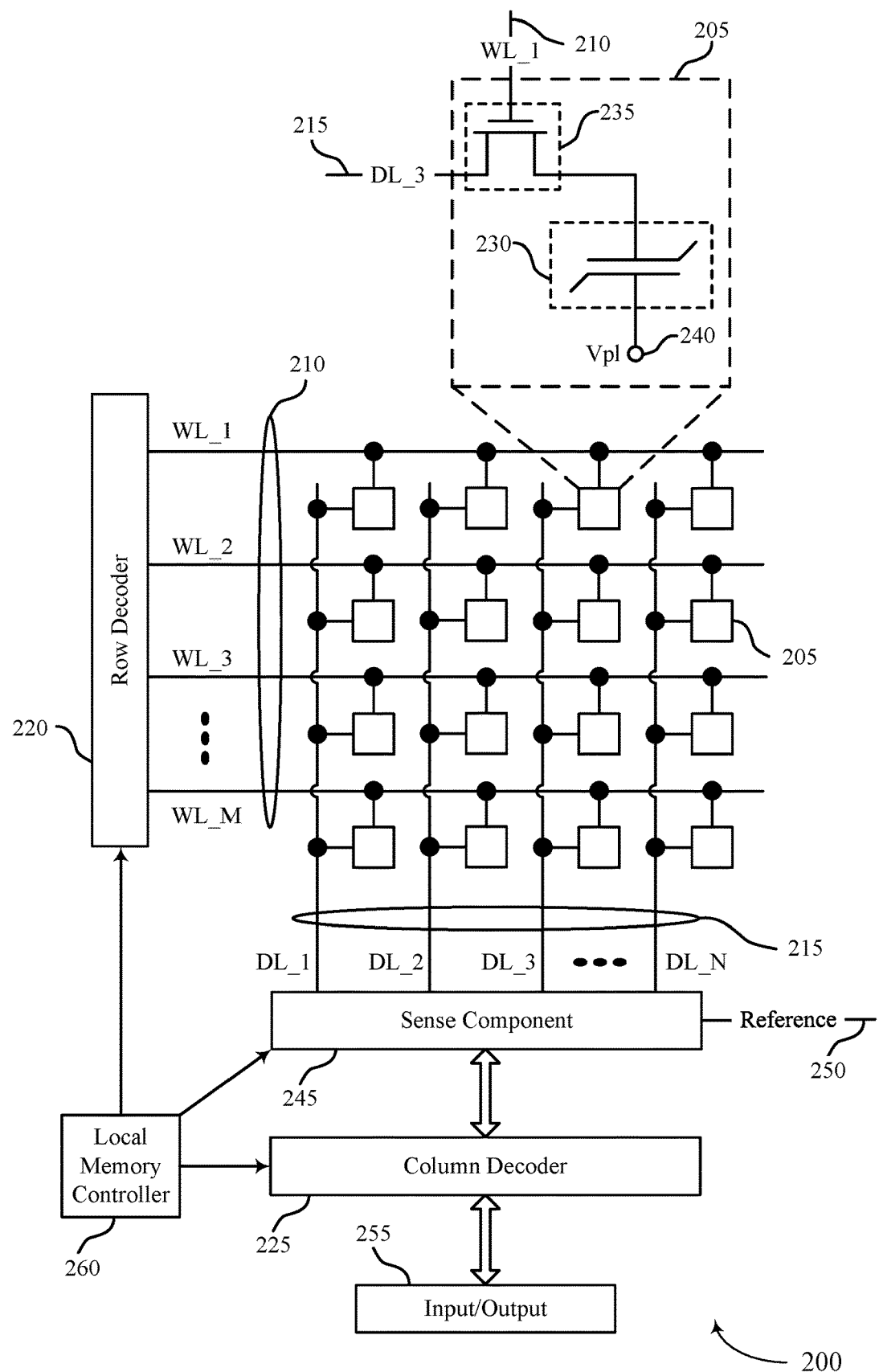
FIG. 2 illustrates an example of a memory die that supports techniques for charging a sense component in accordance with aspects of the present disclosure.

FIG. 2 illustrates an example of a memory die 200 in accordance with various examples of the present disclosure. The memory die 200 may be an example of the memory dice 160 described with reference to FIG. 1. In some cases, the memory die 200 may be referred to as a memory chip, a memory device, or an electronic memory apparatus. The memory die 200 may include one or more memory cells 205 that are programmable to store different logic states. Each memory cell 205 may be programmable to store two or more states. For example, the memory cell 205 may be configured to store one bit of digital logic at a time (e.g., a logic 0 and a logic 1). In some cases, a single memory cell 205 (e.g., a multi-level memory cell) may be configured to store more than one bit of digit logic at a time (e.g., a logic 00, logic 01, logic 10, or a logic 11).

A memory cell 205 may store a charge representative of the programmable states in a capacitor. As used herein, a charge refers to an amount of charge present in or on a component or a conductor and is not limited to a particular value carried by a single proton or electron. DRAM architectures may include a capacitor (e.g., a capacitor 230) that includes a dielectric material to store a charge representative of the programmable state. In some examples, the memory cell 205 may be coupled with a sense component 245 via a digit line 215. In some examples, the digit line 215 may be coupled with a charge transfer device that may be configured, during a read operation, to transfer a charge between the digit line 215 and a sense node of the sense component 245.

Operations such as reading and writing may be performed on memory cells 205 by activating or selecting access lines such as a word line 210 and/or a digit line 215. In some cases, digit lines 215 may also be referred to as bit lines. References to access lines, word lines and digit lines, or their analogues, are interchangeable without loss of understanding or operation. Activating or selecting a word line 210 or a digit line 215 may include applying a voltage to the respective line.

The memory die 200 may include the access lines (e.g., the word lines 210 and the digit lines 215) arranged in a grid-like pattern. Memory cells 205 may be positioned at intersections of the word lines 210 and the digit lines 215. By biasing a word line 210 and a digit line 215 (e.g., applying a voltage to the word line 210 or the digit line 215), a single memory cell 205 may be accessed at their intersection.

Accessing the memory cells 205 may be controlled through a row decoder 220 and a column decoder 225. For example, a row decoder 220 may receive a row address from the local memory controller 260 and activate a word line 210 based on the received row address. A column decoder 225 may receive a column address from the local memory controller 260 and may activate a digit line 215 based on the received column address. For example, the memory die 200 may include multiple word lines 210, labeled WL_1 through WL_M, and multiple digit lines 215, labeled DL_1 through DL_N, where M and N depend on the size of the memory array. Thus, by activating a word line 210 and a digit line 215, e.g., WL_1 and DL_3, the memory cell 205 at their intersection may be accessed. The intersection of a word line 210 and a digit line 215, in either a two-dimensional or three-dimensional configuration, may be referred to as an address of a memory cell 205.

The memory cell 205 may include a logic storage component, such as capacitor 230 and a cell switching component 235. The capacitor 230 may be an example of a dielectric capacitor or a ferroelectric capacitor. A first node of the capacitor 230 may be coupled with the cell switching component 235 and a second node of the capacitor 230 may be coupled with a voltage source 240. In some cases, the voltage source 240 may be the cell plate reference voltage, such as Vpl. In some cases, the voltage source 240 may be an example of a plate line coupled with a plate line driver. The cell switching component 235 may be an example of a transistor or any other type of switch device that selectively establishes or de-establishes electronic communication between two components.

Selecting or deselecting the memory cell 205 may be accomplished by activating or deactivating the cell switching component 235. The capacitor 230 may be in electronic communication with the digit line 215 using the cell switching component 235. For example, the capacitor 230 may be isolated from digit line 215 when the cell switching component 235 is deactivated, and the capacitor 230 may be coupled with digit line 215 when the cell switching component 235 is activated. In some cases, the cell switching component 235 is a transistor and its operation may be controlled by applying a voltage to the transistor gate, where the voltage differential between the transistor gate and transistor source may be greater or less than a threshold voltage of the transistor. In some cases, the cell switching component 235 may be a p-type transistor or an n-type transistor. The word line 210 may be in electronic communication with the gate of the cell switching component 235 and may activate/deactivate the cell switching component 235 based on a voltage being applied to the word line 210.

A word line 210 may be a conductive line in electronic communication with a memory cell 205 that is used to perform access operations on the memory cell 205. In some architectures, the word line 210 may be in electronic communication with a gate of a cell switching component 235 of a memory cell 205 and may be configured to control the cell switching component 235 of the memory cell. In some architectures, the word line 210 may be in electronic communication with a node of the capacitor of the memory cell 205 and the memory cell 205 may not include a switching component.

A digit line 215 may be a conductive line that connects the memory cell 205 with a sense component 245. In some architectures, the memory cell 205 may be selectively coupled with the digit line 215 during portions of an access operation. For example, the word line 210 and the cell switching component 235 of the memory cell 205 may be configured to couple and/or isolate the capacitor 230 of the memory cell 205 and the digit line 215. In some architectures, the memory cell 205 may be in electronic communication (e.g., constant) with the digit line 215. The digit line 215 may be coupled with a charge transfer device (e.g., a first transistor), which may be coupled with a sense node of the sense component 245.

In some examples, the digit line 215 may be configured to receive charge from (e.g., to be biased by) the memory cell 205. In other words, the memory cell 205 may be discharged onto digit line 215, which may bias the digit line 215 to a second voltage. The second voltage on the digit line 215 may be representative of or related to a logic state stored in the memory cell 205. For example, if the memory cell 205 were to store a logic "0" and be discharged onto the digit line 215, the digit line 215 may be biased to a different voltage than if the memory cell 205 were to store a logic "1" and be discharged onto the digit line 215. In some examples, the charge transfer device may remain activated or become deactivated (or less conductive) based on different logic states of the memory cell 205 (hence different voltages of the digit line 215) to facilitate transferring of charge between the digit line 215 to the sense node of the sense component 245.

The sense component 245 may be configured to detect a charge stored on the capacitor 230 of the memory cell 205 and determine a logic state of the memory cell 205 based on the stored charge. The charge stored by a memory cell 205 may be extremely small, in some cases. As such, the sense component 245 may include one or more sense amplifiers to amplify the signal output by the memory cell 205. The sense amplifiers may detect small changes in the charge of a digit line 215 during a read operation and may produce signals corresponding to a logic state 0 or a logic state 1 based on the detected charge. During a read operation, the capacitor 230 of memory cell 205 may output a signal (e.g., discharge a charge) to its corresponding digit line 215. The signal may cause a voltage of the digit line 215 to change.

The sense component 245 may be configured to compare the signal received from the memory cell 205 across the digit line 215 to a reference signal 250 (e.g., reference voltage). The sense component 245 may determine the stored state of the memory cell 205 based on the comparison. For example, in binary-signaling, if digit line 215 has a higher voltage than the reference signal 250, the sense component 245 may determine that the stored state of memory cell 205 is a logic 1 and, if the digit line 215 has a lower voltage than the reference signal 250, the sense component 245 may determine that the stored state of the memory cell 205 is a logic 0. The sense component 245 may include various transistors or amplifiers to detect and amplify a difference in the signals.

The detected logic state of memory cell 205 may be output through column decoder 225 as output 255. In some cases, the sense component 245 may be part of another component (e.g., a column decoder 225, a row decoder 220). In some cases, the sense component 245 may be in electronic communication with the row decoder 220 or the column decoder 225. In some examples, a sense node of the sense component 245 may, through a switching component (e.g., a transistor), be coupled with an I/O line during an access operation (e.g., read operation, write operation).

In some cases, a node (e.g., a sense node) of the sense component 245 may be precharged to different precharge voltages during various phases of an access operation (e.g., a read operation or a write operation). The node may be coupled with a voltage source using the switching component. Further, the voltage source may be configured to output different voltages (e.g., at least two different precharge voltages) during different phases of the access operation. In some cases, the switching component may include a transistor that may be configured to selectively couple the node with the voltage source during a duration of the access operation and with the I/O line during another duration of the access operation. In other cases, the switching component may include a first transistor that may be configured to couple the node with a first voltage source during a first duration of the access operation and a second transistor that may be configured to couple the node with a second voltage source and/or the I/O line during a second duration of the access operation.

The local memory controller 260 may control the operation of memory cells 205 through the various components (e.g., row decoder 220, column decoder 225, and sense component 245). The local memory controller 260 may be an example of the local memory controller 165 described with reference to FIG. 1. In some cases, one or more of the row decoder 220, column decoder 225, and sense component 245 may be co-located with the local memory controller 260. The local memory controller 260 may be configured to receive commands and/or data from an external memory controller 105 (or a device memory controller 155 described with reference to FIG. 1), translate the commands and/or data into information that can be used by the memory die 200, perform one or more operations on the memory die 200, and communicate data from the memory die 200 to the external memory controller 105 (or the device memory controller 155) in response to performing the one or more operations.

The local memory controller 260 may generate row and column address signals to activate the target word line 210 and the target digit line 215. The local memory controller 260 may also generate and control various voltages or currents used during the operation of the memory die 200. In general, the amplitude, shape, or duration of an applied voltage or current discussed herein may be adjusted or varied and may be different for the various operations discussed in operating the memory die 200.

In some cases, the local memory controller 260 may be configured to perform a write operation (e.g., a programming operation) on one or more memory cells 205 of the memory die 200. During a write operation, a memory cell 205 of the memory die 200 may be programmed to store a desired logic state. In some cases, a plurality of memory cells 205 may be programmed during a single write operation. The local memory controller 260 may identify a target memory cell 205 on which to perform the write operation. The local memory controller 260 may identify a target word line 210 and a target digit line 215 in electronic communication with the target memory cell 205 (e.g., the address of the target memory cell 205). The local memory controller 260 may activate the target word line 210 and the target digit line 215 (e.g., applying a voltage to the word line 210 or digit line 215), to access the target memory cell 205. The local memory controller 260 may apply a specific signal (e.g., voltage) to the digit line 215 during the write operation to store a specific state (e.g., charge) in the capacitor 230 of the memory cell 205, the specific state (e.g., charge) may be indicative of a desired logic state.

In some cases, the local memory controller 260 may be configured to perform a read operation (e.g., a sense operation) on one or more memory cells 205 of the memory die 200. During a read operation, the logic state stored in a memory cell 205 of the memory die 200 may be determined. In some cases, a plurality of memory cells 205 may be sensed during a single read operation. The local memory controller 260 may identify a target memory cell 205 on which to perform the read operation. The local memory controller 260 may identify a target word line 210 and a target digit line 215 in electronic communication with the target memory cell 205 (e.g., the address of the target memory cell 205).

The local memory controller 260 may activate the target word line 210 and the target digit line 215 (e.g., applying a voltage to the word line 210 or digit line 215), to access the target memory cell 205. The target memory cell 205 may transfer a signal to the sense component 245 in response to biasing the access lines. The sense component 245 may amplify the signal. The local memory controller 260 may fire the sense component 245 (e.g., latch the sense component) and thereby compare the signal received from the memory cell 205 to the reference signal 250. Based on that comparison, the sense component 245 may determine a logic state that is stored on the memory cell 205. The local memory controller 260 may communicate the logic state stored on the memory cell 205 to the external memory controller 105 (or the device memory controller 155) as part of the read operation.

In some memory architectures, accessing the memory cell 205 may degrade or destroy the logic state stored in a memory cell 205. For example, a read operation performed in DRAM architectures may partially or completely discharge the capacitor of the target memory cell. The local memory controller 260 may perform a re-write operation or a refresh operation to return the memory cell to its original logic state. The local memory controller 260 may re-write the logic state to the target memory cell after a read operation. In some cases, the re-write operation may be considered part of the read operation. Additionally, activating a single access line, such as a word line 210, may disturb the state stored in some memory cells in electronic communication with that access line. Thus, a re-write operation or refresh operation may be performed on one or more memory cells that may not have been accessed.

In some cases, an apparatus may include a memory cell coupled with a digit line and a sense component including a sense node and configured to determine a logic state stored on the memory cell during a read operation, where the sense node may be coupled with a first transistor and a second transistor that may be configured to selectively couple the sense node with a voltage source. The apparatus may further include a controller coupled with the memory cell and the sense component, where the controller may be configured to charge the sense node to a first precharge voltage, bias a gate of the first transistor to a first voltage based on charging the sense node to the first precharge voltage, charge the sense node to a second precharge voltage different than the first precharge voltage based on biasing the gate of the first transistor to the first voltage, couple the sense node with the digit line based on charging the sense node to the second precharge voltage, and determine the logic state stored on the memory cell based on coupling the sense node with the digit line.

Figure 3:
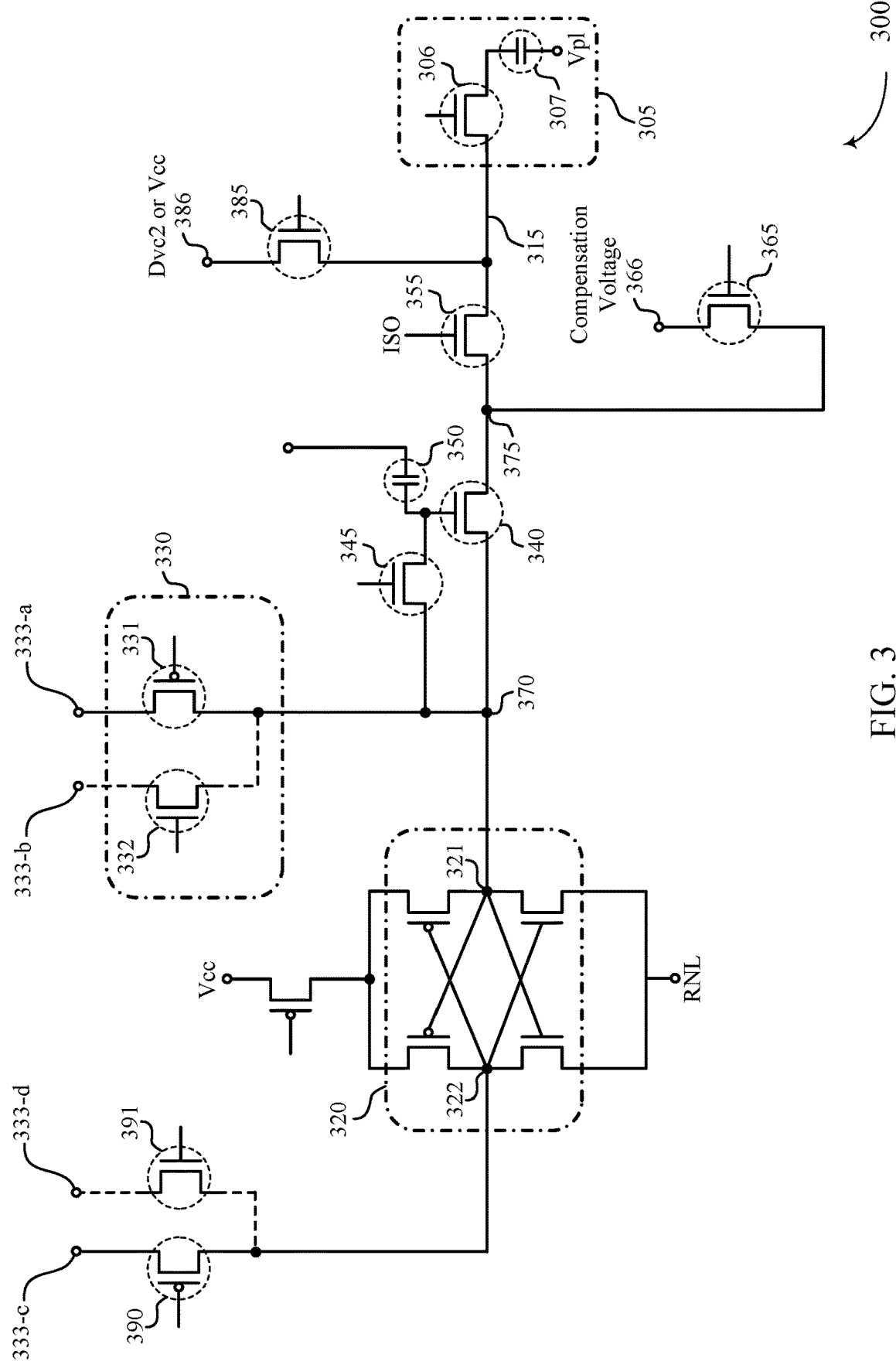
FIG. 3 illustrates an example of a circuit that supports techniques for charging a sense component in accordance with aspects of the present disclosure.

FIG. 3 illustrates a circuit 300 that supports techniques for charging a sense component in accordance with aspects of the present disclosure. The circuit 300 illustrates how a switching component may couple a node of a sense component with a voltage source during a read operation and other components and circuitry that may accompany such a configuration. The circuit 300 may include one or more components described herein with reference to FIGS. 1 and 2. For example, the circuit 300 may include a memory cell 305, which may be an example of memory cell 205 as described with reference to FIG. 2; a digit line 315, which may be an example of digit line 215 as described with reference to FIG. 2; a sense component 320, which may be an example of sense component 245 as described with reference to FIG. 2; a switching component 330; a charge transfer device 340; a compensation device 345; a gate capacitor 350; and an isolation device 355. In some examples, the charge transfer device 340 may be referred to as a first transistor and the switching component 330 may be referred to as a second transistor.

The switching component 330 may include a column select transistor 331 that may be coupled with a node 370. The column select transistor 331 may be configured to couple the node 370 (e.g., the sense node 321 of the sense component 320) with a node 333-a. The node 333-a may be coupled with an I/O line during some durations of an access operation (e.g., read operation, write operation). The I/O line (which may be referred to as LIO in some cases) may be configured to transfer a signal associated with a logic state of a memory cell to another component (e.g., an external memory controller 105 as described with reference to FIG. 1). Further, the node 333-a may be coupled with a precharge voltage (e.g., an output of a voltage supply that may provide various precharge voltages) during some duration of the access operation. As a result, the column select transistor 331 may be configured to couple the node 370 (e.g., a node of the charge transfer device 340) to a precharge voltage or an I/O line (e.g., LIO) during different phases of a read operation. As such, in some cases, the column select transistor 331 may serve at least two functions as described herein, namely coupling the node 370 with the I/O line or with the precharge voltage based on access operations (e.g., read operation, write operation) or different phases of a read operation. The column select transistor 331 may be a p-type field-effect transistor (FET) as depicted in the circuit 300, but may be an n-type FET in other examples.

Additionally, the switching component 330 may include a precharge transistor 332 that may be coupled with the node 370. The precharge transistor 332 may be configured to couple the node 370 (e.g., a node of the charge transfer device 340, a sense node 321 of the sense component 320) with a node 333-b (e.g., a precharge voltage) during a read operation. In this manner, when the switching component 330 includes the column select transistor 331 and the precharge transistor 332, the column select transistor 331 may serve at least one function as described herein, namely coupling the node 370 with the node 333-a, which may be coupled with an I/O line and the precharge transistor 332 may couple the node 370 to the precharge voltage through the node 333-b. The precharge transistor 332 may be an n-type FET as depicted in the circuit 300, but may be a p-type FET in other examples.

The node 370 may be coupled to two or more voltage sources. In such cases, one or more transistors (e.g., column select transistor 331 or column select transistor 331 and precharge transistor 332 in combination) may be configured to selectively couple the node 370 with the two or more voltage sources. In some cases, a transistor (e.g., column select transistor 331) may be configured to selectively couple the node 370 with the node 333-a, which may be coupled with a first voltage source (e.g., LIO) during a first duration of a read operation or a second voltage source (e.g., a precharge voltage) during a second duration of the read operation. In some cases, a transistor (e.g., column select transistor 331) may be configured to selectively couple the node 370 with a first voltage source (e.g., LIO through the node 333-a) during a first duration of a read operation and a second transistor (e.g., precharge transistor 332) may be configured to selectively couple the node 370 with a second voltage source (e.g., precharge voltage through the node 333-b) during a second duration of the read operation. In some instances, one of the voltage sources may also comprise an I/O line (e.g., LIO) as described herein.

In some cases, a reference node 322 of the sense component 320 may be coupled with components that duplicate the switching component 330—e.g., for layout reasons. Namely, a sixth transistor 390 may correspond to the column select transistor 331, a seventh transistor 391 may correspond to the precharge transistor 332. Similarly, a node 333-c may correspond to the node 333-a and a node 333-d may correspond to the node 333-b.

The voltage source 333 (e.g., the voltage source that provides precharge voltage) may be configured to output different voltages (e.g., at least two different precharge voltages) during different phases of a read operation. For example, the voltage source 333 may output a first precharge voltage to bias a gate of the charge transfer device 340 to a first voltage during a first duration of the read operation. Additionally, the voltage source 333 may output a second precharge voltage that may facilitate the charge transfer device 340 to transfer a charge between the sense node 321 and the digit line 315 that is coupled with the memory cell 305 during a second duration of the read operation. Further, the voltage source 333 may be configured to output a first range of voltages for the first precharge voltage and a second range of voltages for the second precharge voltage so as to facilitate trimming (e.g., adjusting) of the output voltage (e.g., the first precharge voltage, the second precharge voltage) to mitigate undesirable effects of fabrication process variations (e.g., variations in a threshold voltage of the charge transfer device 340).

The switching component 330 (e.g., the column select transistor 331, the precharge transistor 332) may be configured to apply the first precharge voltage and the second precharge voltage to a node (e.g., the node 370) of the charge transfer device 340 during the read operation. Further, the switching component 330 (e.g., the column select transistor 331, the precharge transistor 332) may be configured to decouple or isolate the node (e.g., the node 370) from the voltage source 333 during a third duration of the read operation. For example, the switching component 330 (e.g., the column select transistor 331, the precharge transistor 332) may isolate the node 370 from the voltage source 333 after applying the first precharge voltage or the second precharge voltage to the node 370 (hence a node the charge transfer device 340, a sense node 321 of the sense component 320).

The circuit 300 may include a fourth transistor 365 coupled with a second node 375 that is coupled with the charge transfer device 340. The fourth transistor 365 may be coupled with a second voltage source 366 (e.g., a compensation voltage) when activated during a read operation. The fourth transistor 365 may be configured to precharge the second node 375 during a portion of the read operation, during which a gate of the charge transfer device 340 may be biased to a first voltage. In some cases, the first voltage at the gate of the charge transfer device 340 may represent a voltage that may be the compensation voltage plus the threshold voltage of the charge transfer device 340 (e.g., compensation voltage+$V_T$).

Further, the circuit 300 may include a compensation device 345 that may be coupled with the gate of the charge transfer device 340. The compensation device 345 may facilitate biasing the gate of the charge transfer device 340 to the first voltage. The first voltage may be based on the voltage of second node 375 plus the threshold voltage of the charge transfer device 340 during a compensation phase of the read operation (e.g., a precharge voltage of the digit line 315 such as Dvc2 or the compensation voltage). In some cases, statistical process variations (e.g., variations in gate oxide thicknesses, fluctuations in ion-implantation conditions) may contribute to the threshold voltage differential.

The circuit 300 may also include the gate capacitor 350 configured to fine tune a voltage at the gate of the charge transfer device 340 and/or to maintain the voltage at the gate of the charge transfer device 340 at a fixed voltage (e.g., at a first voltage).

The circuit 300 may also include the isolation device 355 coupled with the second node 375 and the digit line 315. The isolation device 355 may be coupled with the digit line 315 and configured to isolate the second node 375 from the digit line 315 when deactivated and couple the second node 375 with the digit line 315 when activated.

In some cases, a memory device may include a memory cell coupled with a digit line, a sense component configured to determine a logic state stored on the memory cell during a read operation, a first transistor coupled with the sense component and configured to transfer a charge between the digit line and the sense component, and a second transistor configured to selectively couple the sense component with a voltage source that may be configured to precharge the sense component to a first precharge voltage during a first duration of the read operation and to a second precharge voltage during a second duration of the read operation, where the second transistor may be configured to apply the first precharge voltage and the second precharge voltage to a node of the first transistor during the read operation. In some cases, the voltage source may be configured to output a first range of voltages for the first precharge voltage and a second range of voltages for the second precharge voltage.

In some cases, the second transistor may include a p-channel FET (e.g., a p-type FET) and may be configured to selectively couple the sense component with an I/O line that may be configured to transfer a signal associated with the logic state of the memory cell based on determining the logic state stored on the memory cell. In some cases, the memory device may further include a third transistor configured to selectively couple the sense component with an I/O line that may be configured to transfer a signal associated with the logic state of the memory cell based on determining the logic state stored on the memory cell. In some cases, the second transistor may include an n-channel FET (e.g., an n-type FET) and may be configured to decouple the sense component from the voltage source during a third duration of the read operation based on applying the first precharge voltage or the second precharge voltage to the node of the first transistor.

In some cases, the second transistor may be configured to be activated to charge the sense component to the first precharge voltage after isolating the digit line from the first transistor and the second transistor may be configured to be deactivated after charging the sense component to the first precharge voltage. In some cases, the second transistor may be configured to be activated to charge the sense component to the second precharge voltage after biasing a gate of the first transistor to a first voltage and the second transistor may be configured to be deactivated before coupling the digit line with the first transistor.

Figure 4:
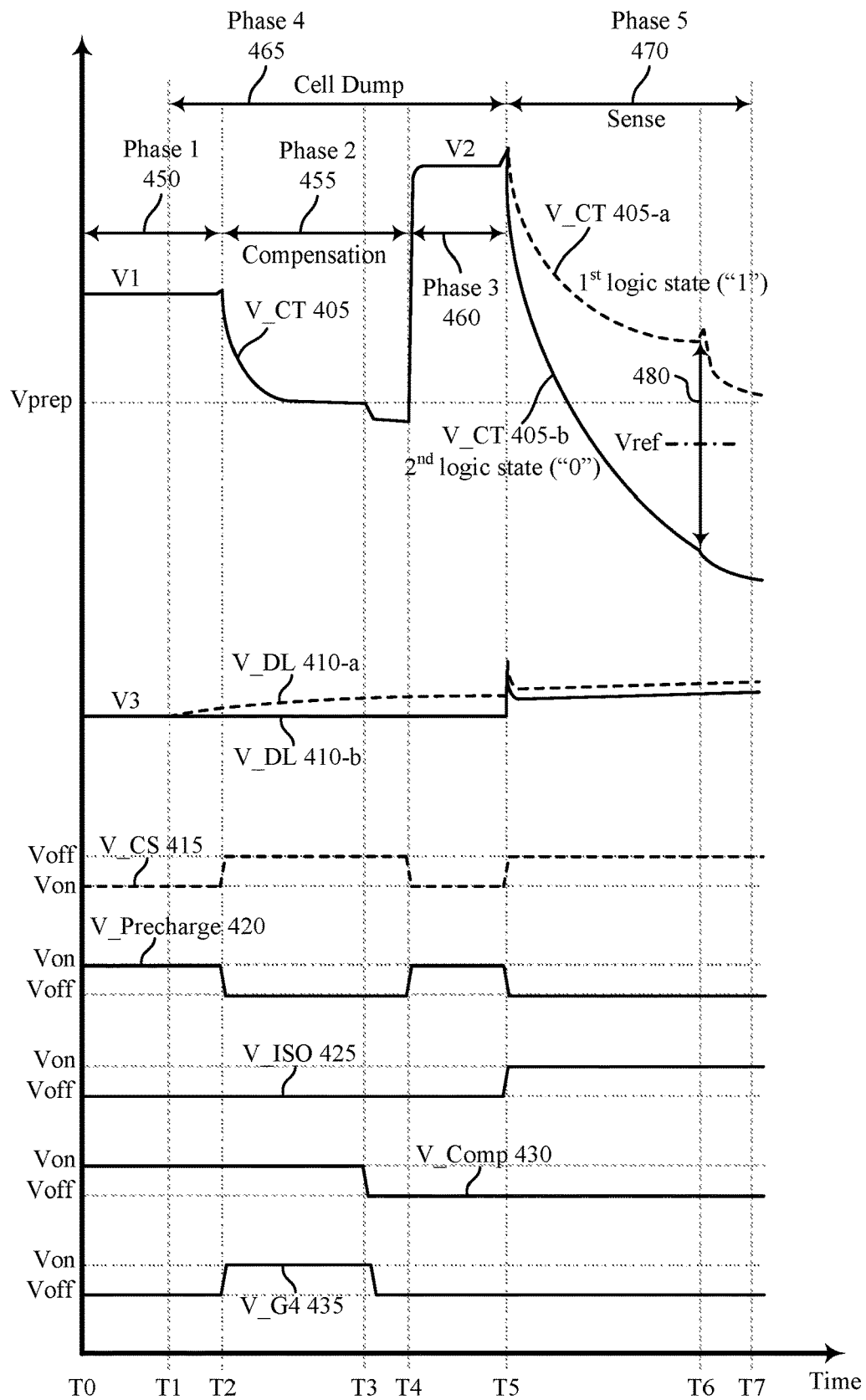
FIG. 4 illustrates an example of a timing diagram that supports techniques for charging a sense component in accordance with aspects of the present disclosure.

FIG. 4 illustrates a timing diagram 400 that supports techniques for charging a sense component in accordance with aspects of the present disclosure. The timing diagram 400 illustrates procedures of a read operation to sense a logic state stored on a memory cell. The timing diagram 400 shows various voltage levels (e.g., voltage signals as a function of time) associated with the components and the nodes of the circuit 300 described with reference to FIG. 3 to illustrate how the read operation may be performed. Thus, the timing diagram 400 may illustrate the operation of one or more components described with reference to FIGS. 1, 2, and 3. The time and voltage scales used in FIG. 4 are for illustration purposes only and may not necessarily depict particular values in some cases.

The timing diagram 400 includes V_CT 405 (e.g., a voltage of the node 370 as described with reference to FIG. 3), V_DL 410 (e.g., a voltage associated with the digit line 315 as described with reference to FIG. 3), V_CS 415 (e.g., a voltage of a gate of the column select transistor 331 as described with reference to FIG. 3), V_Precharge 420 (e.g., a voltage of a gate of the precharge transistor 332 as described with reference to FIG. 3), V_ISO 425 (e.g., a voltage of a gate of the isolation device 355 as described with reference to FIG. 3), V_Comp 430 (e.g., a control voltage applied to a gate of the compensation device 345 as described with reference to FIG. 3), and V_G4 435 (e.g., a voltage of a gate of the fourth transistor 365 as described with reference to FIG. 3). As used herein, Von refers to a voltage greater than or equal to a transistor's threshold voltage to activate the transistor. Similarly, Voff refers to a voltage less than a transistor's threshold voltage to deactivate the transistor.

During the first phase 450 (e.g., phase 1), the node 370 may be precharged to a first voltage level (e.g., V1) as part of or before a compensation phase (e.g., second phase 455). During the first phase 450, the switching component 330 may be activated to couple the node 370 (e.g., the charge transfer device 340 and the sense component 320, both coupled with the node 370) with a voltage source (e.g., the voltage source 333 as described with reference to FIG. 3). For example, V_CS 415 corresponds to Von to activate the column select transistor 331, which may be a p-type FET, or V_Precharge 420 corresponds to Von to activate the precharge transistor 332, which may be an n-type FET. In some cases, the column select transistor 331 may be an n-type FET and the precharge transistor 332 may be a p-type FET. The voltage source (e.g., the voltage source 333-a or the voltage source 333-b) may output a first precharge voltage such that the switching component 330 may apply the first precharge voltage to the node 370—e.g., V_CT 405 precharged to V1 (e.g., 1 V).

Still referring to the first phase 450 (e.g., phase 1), the isolation device 355 may be deactivated—e.g., V_ISO 425 may correspond to Voff to deactivate the isolation device 355—during the first phase 450 to isolate the charge transfer device 340 from the digit line 315. The digit line 315 may be precharged to a third precharge voltage—e.g., V_DL 410 precharged to V3 (e.g., 500 mV)—during the first phase 450. The fourth transistor 365 may be deactivated—e.g., V_G4 435 corresponds to Voff to deactivate the fourth transistor 365—while the node 370 may be precharged to the first voltage (e.g., V1) during the first phase 450. In addition, the compensation device 345 may be activated—e.g., V_Comp 430 corresponds to Von to activate the compensation device 345—during the first phase 450 to couple the gate of the charge transfer device 340 with the node 370. The first phase 450 may be referred to as a first precharge duration or a first precharge phase.

In some cases, the first precharge voltage may be applied in preparation for the compensation phase (e.g., the second phase 455) during which the gate of charge transfer device 340 may be biased at a first voltage (e.g., achieving the compensation). In other words, the first precharge voltage established during the first phase 450 may be determined to be high enough to establish the first voltage at the gate of the charge transfer device 340 during the compensation phase. In some cases, the first voltage may be based on a threshold voltage of the charge transfer device 340, the third precharge voltage (e.g., V3) used to precharge the digit line 315, or the compensation voltage, or any combination thereof.

As such, the first precharge voltage (e.g., 1 V) may be determined to be greater than the first voltage of the gate of the charge transfer device 340. In some cases, an output of the voltage source (e.g., the voltage source 333) may be modified to be a voltage different than the first precharge voltage based on charging the sense node (e.g., the node 370 coupled with the sense node 321 of the sense component 320) to the first precharge voltage. In some cases, the second precharge voltage may be greater than the first precharge voltage.

Further, the first precharge voltage may be determined to avoid excessive power consumption because the node 370 may be coupled with additional components (e.g., the gate capacitor 350 coupled with the node 370 through the activated compensation device 345) during the first phase 450.

During the second phase 455 (e.g., phase 2), the gate of the charge transfer device 340 may be set to a first voltage (e.g., Vprep) in preparation for sensing a logic state stored on a memory cell (e.g., during the fifth phase 470). The first voltage may be based on a threshold voltage associated with the charge transfer device 340. The switching component 330 may be deactivated at time T2—e.g., V_CS 415 corresponds to Voff to deactivate the column select transistor 331 or V_Precharge 420 corresponds to Voff to deactivate the precharge transistor 332—based on precharging the node 370 to the first precharge voltage. As a result, V_CT 405 may start to decrease from the first precharge voltage (e.g., V1) at time T2. Also, the isolation device 355 may remain deactivated—e.g., V_ISO 425 remains at Voff—during the second phase 455 to isolate the charge transfer device 340 from the digit line 315. The compensation device 345 may remain activated—e.g., V_Comp 430 remains at Von—until time T3 thereby causing the gate of the charge transfer device 340 to also be biased to V_CT 405. Additionally, the fourth transistor 365 may be activated at time T2—e.g., V_G4 435 switches to Von at time T2 to activate the fourth transistor 365—to provide a constant voltage (e.g., a compensation voltage) to the second node 375. The V_CT 405 may decrease to the first voltage, where the first voltage may be the voltage applied to the second node 375 (e.g., the compensation voltage) and the threshold voltage ($V_T$) of the charge transfer device 340 (e.g., the first voltage may equal the compensation voltage plus $V_T$).

Still referring to the second phase 455 (e.g., phase 2), at time T3, the compensation device 345 may be deactivated—e.g., V_Comp 430 switches to Voff at time T3—thereby isolating the gate of the charge transfer device 340 from the node 370. Further, the fourth transistor 365 may be deactivated after the compensation device 345 is deactivated at time T3—e.g., V_G4 435 switches to Voff soon after time T3. In some cases, deactivation of the fourth transistor 365 may happen anytime between time T3 and time T4—e.g., V_G4 435 switches to Voff at any time between T3 and T4. The second phase 455 may be referred to as a compensation duration or a compensation phase.

During the third phase 460 (e.g., phase 3), the node 370 may be precharged to a second voltage level (e.g., V2) before or as part of a sense phase (e.g., fifth phase 470). During the third phase 460, the switching component 330 may be activated—e.g., V_CS 415 corresponds to Von to activate the column select transistor 331, which may be a p-type FET or V_Precharge 420 corresponds to Von to activate the precharge transistor 332, which may be an n-type FET—to couple the node 370 (e.g., the charge transfer device 340 and the sense component 320, both coupled with the node 370) with the voltage source (e.g., the voltage source 333). The voltage source (e.g., the voltage source 333) may output a second precharge voltage such that the switching component 330 may apply the second precharge voltage to the node 370—e.g., V_CT 405 precharged to V2 (e.g., 1.6 V). As such, V_CT 405 may be precharged to V2 (e.g., 1.6 V) based on biasing the gate of the charge transfer device 340 to the first voltage. Also, the isolation device 355 may remain deactivated during the third phase 460—e.g., V_ISO 425 remains at Voff—to isolate the charge transfer device 340 from the digit line 315. The third phase 460 may be referred to as a second precharge duration or a second precharge phase.

In some cases, the second precharge voltage may be applied in preparation for transferring charge using the charge transfer device 340 during the fifth phase 470 (e.g., a sense phase). In some cases, transferring a charge between the digit line 315 and the sense component 320 (e.g., the sense node 321 of the sense component 320) may be based on precharging the node 370 to the second precharge voltage (e.g., V2). In some cases, a sense window (e.g., the sense window 480) may be related to (e.g., proportional to) a difference between the second precharge voltage and the third precharge voltage associated with the digit line 315 (e.g., V3 of V_DL 410). In some cases, a sense window may be referred to as a read window of a memory cell. Further, the gate capacitor 350 is no longer coupled with the node 370 (e.g., the compensation device 345 is deactivated during the third phase 460) such that power consumption associated with precharging the node 370 to the second precharging voltage may be alleviated. As such, the second precharge voltage (e.g., 1.6 V) may be determined to be greater than the first precharge voltage (e.g., 1 V). In some cases, the second precharge voltage (e.g., 1.6 V) may be determined to be greater than a second voltage of the digit line, where the second voltage of the digit line may be based on the logic state stored on the memory cell. In some cases, the higher the second precharge voltage the larger the sense window 480. Higher precharge voltages, however, may consume more power and may increase the time needed for a full charge transfer to occur during the sense phase (e.g., fifth phase 470).

During the fourth phase 465 (e.g., phase 4), the memory cell 305 may be coupled with the digit line 315 at time T1 by activating a cell switching component 306 (e.g., selecting a word line associated with a gate of the cell switching component 306). V_DL 410 (e.g., V_DL 410 precharged to V3 prior to time T1) may develop a signal based on a logic state stored in the memory cell 305 (e.g., a charge stored in the capacitor 307). In other words, the digit line 315 may be biased to a second voltage based on discharging the memory cell 305 on to the digit line 315. In some cases, a first logic state (e.g., logic 1) stored in the memory cell 305 may cause V_DL 410 to rise from V3 (e.g., V_DL 410-a). In other cases, a second logic state (e.g., logic 0) stored in the memory cell 305 may leave V_DL 410 relatively unchanged from V3 (e.g., V_DL 410-b). In some cases, the shape of voltage associated with the digit line 315 during the fourth phase 465 (e.g., waveform of V_DL 410) may vary based on the third precharge voltage (e.g., V3) used to precharge the digit line 315. Also, the isolation device 355 may remain deactivated during the fourth phase 465—e.g., V_ISO 425 remains at Voff—to isolate the charge transfer device 340 from the digit line 315. In other words, biasing the digit line 315 to the second voltage may be based on deactivating the isolation device 355, in some cases. The fourth phase 465 may be referred to as a cell dump duration or a cell dump phase.

In some cases, the fourth phase 465 may overlap with part of the first phase 450 (e.g., from time T1 to time T2), the second phase 455 (e.g., from time T2 to time T4), and the third phase 460 (e.g., from T4 to time T5) because the isolation device 355 is deactivated—e.g., V_ISO 425 remains at Voff to keep the isolation device 355 deactivated—to isolate the digit line 315 from the charge transfer device 340 during the first phase 450, the second phase 455, and the third phase 460. In other words, the deactivated isolation device 355 may facilitate concurrent biasing of the digit line 315 (e.g., biasing the digit line 315 to the second voltage during the fourth phase 465, which may have been precharged to V3 (e.g., 500 mV) before time T1) based on discharging the memory cell 305 onto the digit line 315 at time T1.

In some cases, the fourth phase 465 may occur after the second phase 455 is complete. For example, biasing the digit line 315 to a second voltage by discharging the memory cell 305 on to the digit line 315 may be based on biasing the gate of the charge transfer device 340 to the first voltage. In some cases, the digit line 315 may be used to set the first voltage at the gate of the charge transfer device 340 instead of using the fourth transistor 365 and the second voltage source 366 (e.g., the compensation voltage). In such cases, a fifth transistor 385 may be activated to couple the digit line 315 with the voltage source 386 (e.g., Dvc2). In addition, the isolation device 355 may be activated to couple the digit line 315 (e.g., the digit line 315 coupled with Dvc2) with the second node 375 during a portion of the second phase 455. As such, the first voltage at the gate of the charge transfer device 340 may represent a voltage that may be Dvc2 plus the threshold voltage of the charge transfer device 340 (e.g., Dvc2+$V_T$).

During the fifth phase 470 (e.g., phase 5), a charge may be transferred between the node 370 and the digit line 315, a signal on the node 370 may be sensed, and a logic state of the memory cell may be determined based on the sensing. During the fifth phase 470, a charge may be transferred between digit line 315 and the node 370 (e.g., the sense node 321 of the sense component 320) using the charge transfer device 340. In some cases, the isolation device 355 may be activated at time T5—e.g., V_ISO 425 switches to Von to activate the isolation device 355—to couple the digit line 315 (e.g., V_DL 410 that has developed a signal corresponding to a logic state stored in the memory cell 305 during the fourth phase 465) with the charge transfer device 340 (e.g., the charge transfer device 340 with its gate biased at the first voltage) at the second node 375. In other words, transferring a charge between the digit line (e.g., the digit line 315 biased to the second voltage that may be representative of or related to a logic state stored in the memory cell 305) and the node 370 (e.g., the sense node 321 of the sense component 320) may be based on activating the isolation device 355 at time T5. The fifth phase 470 may be referred to as a sense duration or a sense phase.

In some cases, the switching component 330 may be deactivated at time T5 based on charging the node 370 (e.g., the sense node 321 of the sense component 320) to the second precharge voltage (e.g., V2)—e.g., V_CS 415 switches to Voff at time T5 to deactivate the column select transistor 331 or V_Precharge 420 switches to Voff at time T5 to deactivate the precharge transistor 332. As a result, V_CT 405 may start to decrease from the second precharge voltage (e.g., V2).

In some cases, coupling the charge transfer device 340 with the digit line 315 that has been biased by a memory cell 305 storing a first logic state (e.g., logic 1)—e.g., V_DL 410-*a* depicted with a dotted line, may cause the charge transfer device 340 to be less conductive (e.g., deactivated). In other cases, coupling the charge transfer device 340 with the digit line 315 that has been biased by a memory cell 305 storing a second logic state (e.g., logic 0)—e.g., V_DL 410-*b* depicted with a solid line, may maintain the charge transfer device 340 as conductive (e.g., activated) as it has been prior to the fifth phase 470. Accordingly, V_CT 405 may exhibit different rates of decrease when the charge transfer device 340 is coupled with the digit line 315 at time T5 based on different logic states stored in the memory cell 305—e.g., V_CT 405-*a* depicted with a dotted line, V_CT 405-*b* depicted with a solid line—based on how conductive the charge transfer device 340 may be (e.g., activated or deactivated).

In other words, the charge transfer device 340 may transfer a charge between the digit line 315 and the sense node 321 of the sense component 320 based on a logic state stored in the memory cell 305. In some cases, transferring, using the charge transfer device 340, a charge between the digit line 315 and the sense node 321 of the sense component 320 may be based on the second voltage of the digit line 315 being less than the first voltage on the gate of the charge transfer device 340.

In some cases, a voltage difference in V_CT 405 between the first logic state and the second logic state established during the fifth phase 470 may be referred to as a sense window (e.g., a sense window 480). For example, the sense window may be on the order of 500 mV. In some cases, a reference voltage (e.g., Vref) may be determined as a voltage near a mid-point of the sense window. For example, the reference voltage may be determined to be 600 mV, which may correspond to a voltage near the mid-point of the sense window 480 (e.g., a difference in V_CT 405 corresponding to the first logic state and V_CT 405 corresponding to the second logic state).

At time T6, the sense component 320 may latch the signal established at the sense node 321. As described herein, a latching step during a read operation may refer to various transistors or amplifiers of the sense component 320 detecting and amplifying a difference in signals (e.g., the signal at the sense node 321 with respect to the reference node 322). In some cases, a sixth transistor 390 may couple a reference voltage to the reference node 322 of the sense component 320 before the latching step. A time duration from time T6 to time T7 may be determined to provide a sufficient time for the transistors or amplifiers of the sense component 320 to detect and amplify the difference in signal to determine the logic state of the memory cell 305 during the latching step. In other words, a logic state stored on the memory cell 305 may be determined based on transferring the charge between the digit line 315 and the sense node 321 of the sense component 320. As described herein, the fifth phase 470 may be referred to as a sense duration or a sense phase.

In some cases, the switching component 330 may include a column select transistor (e.g., the column select transistor 331 as described with reference to FIG. 3) that may be configured to selectively couple an I/O line (e.g., the LIO as described with reference to FIG. 3) with the sense node (e.g., the sense node 321 of the sense component 320). In some cases, the I/O line may be configured to transfer a signal associated with the logic state of the memory cell based on determining the logic state stored on the memory cell. In some cases, the switching component 330 may include a column select transistor (e.g., the column select transistor 331 as described with reference to FIG. 3) and a precharge transistor (e.g., the precharge transistor 332 as described with reference to FIG. 3). In such cases, the column select transistor (e.g., the column select transistor 331) may be activated to couple the sense node (e.g., the sense node 321 of the sense component 320) with the I/O line after determining the logic state stored on the memory cell (e.g., the memory cell 305).

In some cases, a memory cell that is configured to store three or more different logic states may be read using the procedures of the timing diagram 400. In such cases, more than one sense component (e.g., a sense component 320 described with reference to FIG. 3) may be coupled with the node 370 (e.g., coupled with a memory cell 305 through a charge transfer device 340 and an isolation device 355). Each sense component may have a same reference voltage (e.g., Vref) in some examples. In some examples, a first sense component may latch at a first time during the fifth phase 470 and a second sense component may latch at second time during the fifth phase 470 after the first time. As V_CT 405 may decrease during the fifth phase 470 based on a logic state stored in the memory cell 305 (e.g., based on how conductive the charge transfer device 340 may be based on the logic state stored in the memory cell 305), the first sense component and the second sense component may detect different voltages on the node 370. In some examples, isolation devices (e.g., similar to an isolation device 355) may be added between the node 370 and the sense components (e.g., the first sense component and the second sense component) such that the node 370 may be coupled with the sense components at different times. Further, the additional isolation devices may be controlled by a timing component configured to activate (or deactivate) different isolation devices at different times. In such examples, both the first sense component and the second sense component may be configured to compare the signal on the node 370 to the same fixed reference voltage, albeit at different times. In other examples, the first sense component and the second sense component may latch at the same time. In such examples, the sense components may compare the signal on the node 370 to different reference voltages. In some examples, the second reference voltage used by the second sense component may be modified based on an output of the first sense component during the read operation.

The combination of the outputs of the two sense components may detect three or more states stored in the memory cell 305 (e.g., logic states 11, 10, and 00), where the first digit corresponds to the first sense component's latching event with respect to the Vref and the second digit corresponds to the second sense component's latching event with respect to the Vref. As such, three or more distinct states (instead of two distinct states as depicted in FIG. 4) may be determined to be associated with the memory cell 305 and therefore more than one bit of digital data may be stored in the memory cell 305 (e.g., a multi-level cell).

Figure 5:
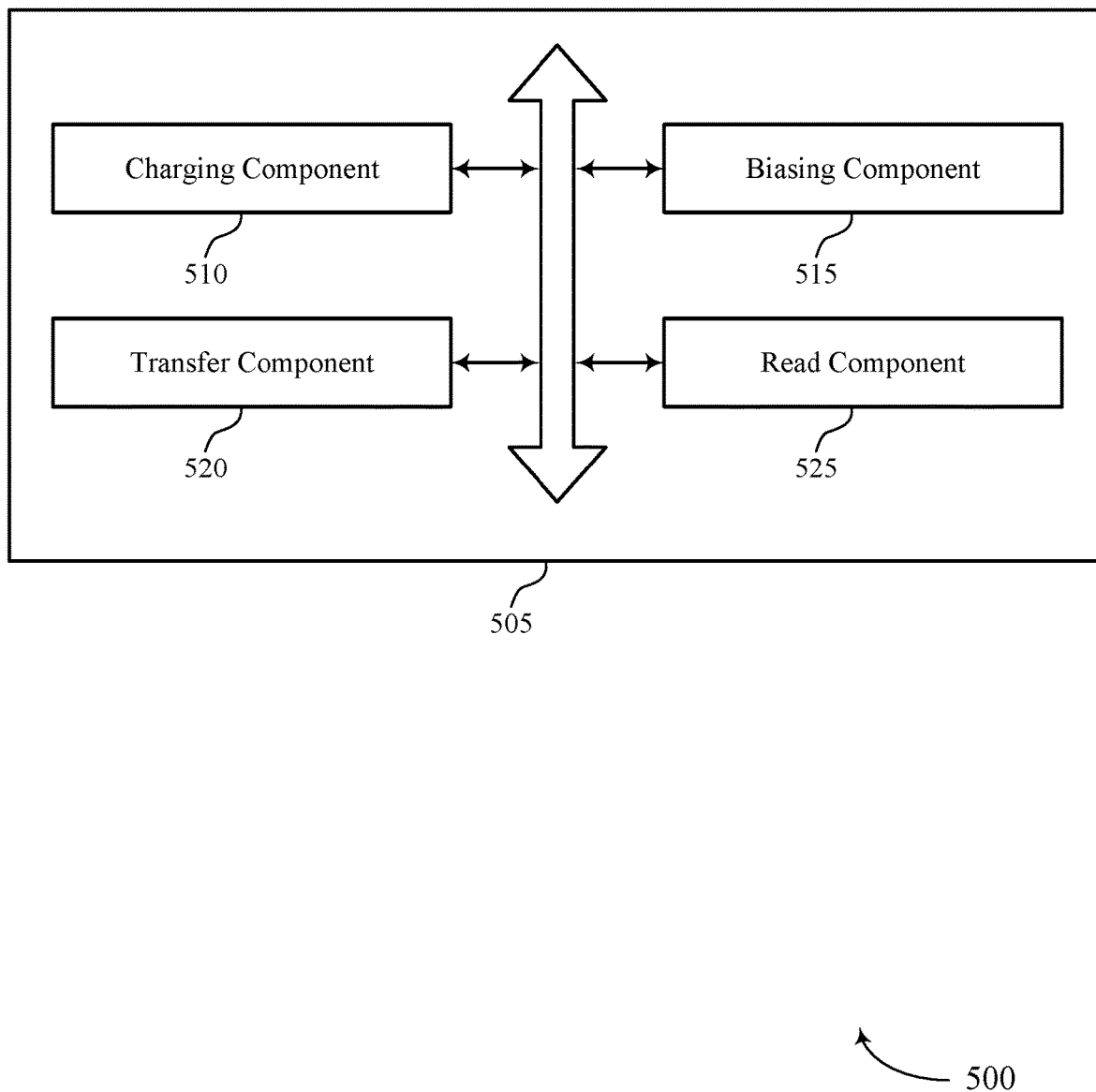
FIG. 5 illustrates an example block diagram of a device that supports techniques for charging a sense component in accordance with aspects of the present disclosure.

FIG. 5 shows an exemplary block diagram 500 of a device 505 that supports techniques for charging a sense component in accordance with aspects of the present disclosure. The device 505 may be an example of aspects of a controller (e.g., device memory controller 155, local memory controller 165, local memory controller 260, as described with reference to FIGS. 1 and 2). The device 505 may include a charging component 510, a biasing component 515, a transfer component 520, and a read component 525. Each of these components may communicate, directly or indirectly, with one another (e.g., via one or more buses).

The charging component 510 may charge a sense node of a sense component to a first precharge voltage, where the sense node may be coupled with a first transistor and a second transistor that may be configured to selectively couple the sense node with a voltage source. In some cases, the charging component 510 may charge the sense node to a second precharge voltage different than the first precharge voltage based on biasing the gate of the first transistor to the first voltage. In some cases, the charging component 510 may modify, based on charging the sense node to the first precharge voltage, an output of the voltage source to be a voltage different than the first precharge voltage. In some cases, the second precharge voltage may be greater than the first precharge voltage. In some cases, the first precharge voltage may be greater than the first voltage of the gate of the first transistor. In some cases, the second precharge voltage may be greater than a second voltage of the digit line, the second voltage of the digit line based on the logic state stored on the memory cell.

The biasing component 515 may bias a gate of the first transistor to a first voltage based on charging the sense node to the first precharge voltage. In some cases, the biasing component 515 may activate the second transistor to couple the sense node with the voltage source that may be configured to output the first precharge voltage during a first duration of a read operation, where charging the sense node to the first precharge voltage may be based on activating the second transistor. In some cases, the biasing component 515 may deactivate the second transistor after the first duration, where biasing the gate of the first transistor to the first voltage may be based on deactivating the second transistor.

In some cases, the biasing component 515 may activate the second transistor to couple the sense node with the voltage source that may be configured to output the second precharge voltage during a second duration of a read operation, where charging the sense node to the second precharge voltage may be based on activating the second transistor. In some cases, the biasing component 515 may deactivate the second transistor before coupling the sense node with the digit line based on charging the sense node to the second precharge voltage. In some cases, the second transistor may be a column select transistor configured to selectively couple an I/O line with the sense node. In some cases, the biasing component 515 may activate a third transistor coupled with the sense node and configured to selectively couple the sense node with an I/O line after determining the logic state stored on the memory cell.

The transfer component 520 may couple the sense node with a digit line associated with a memory cell based on charging the sense node to the second precharge voltage. In some cases, the transfer component 520 may transfer, using the first transistor, a charge between the digit line and the sense node based on coupling the sense node with the digit line, where determining the logic state stored on the memory cell may be based on transferring the charge.

The read component 525 may determining a logic state stored on the memory cell based on coupling the sense node with the digit line.

Figure 6:
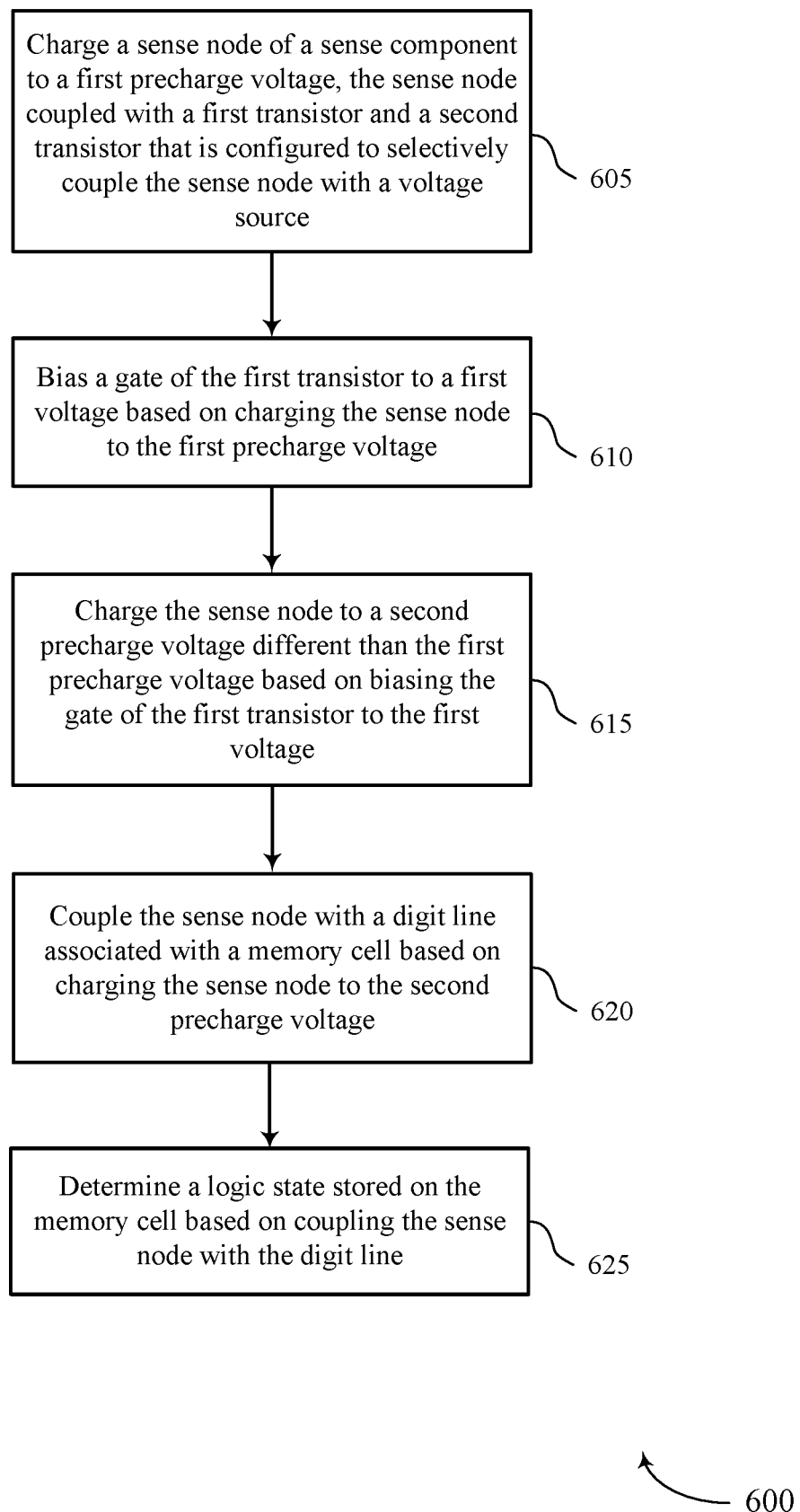
FIGS. 6 and 7 show flowcharts illustrating a method or methods that support techniques for charging a sense component in accordance with aspects of the present disclosure.

FIG. 6 shows a flowchart illustrating a method 600 that supports techniques for charging a sense component in accordance with aspects of the present disclosure. The operations of method 600 may be implemented by a controller or its components as described herein. For example, the operations of method 600 may be performed by a controller (e.g., device memory controller 155, local memory controller 165, local memory controller 260, as described with reference to FIGS. 1 and 2). In some examples, a controller may execute a set of instructions to control the functional elements of the memory array to perform the functions described herein. Additionally or alternatively, a controller may perform aspects of the functions described herein using special-purpose hardware.

At 605 the controller may charge a sense node of a sense component to a first precharge voltage, the sense node coupled with a first transistor and a second transistor that may be configured to selectively couple the sense node with a voltage source. In some examples, aspects of the operations of 605 may be performed by a charging component 510 as described with reference to FIG. 5.

At 610 the controller may bias a gate of the first transistor to a first voltage based on charging the sense node to the first precharge voltage. In some examples, aspects of the operations of 610 may be performed by a biasing component 515 as described with reference to FIG. 5.

At 615 the controller may charge the sense node to a second precharge voltage different than the first precharge voltage based on biasing the gate of the first transistor to the first voltage. In some examples, aspects of the operations of 615 may be performed by the charging component 510 as described with reference to FIG. 5.

At 620 the controller may couple the sense node with a digit line associated with a memory cell based on charging the sense node to the second precharge voltage. In some examples, aspects of the operations of 620 may be performed by a transfer component 520 as described with reference to FIG. 5.

At 625 the controller may determine a logic state stored on the memory cell based on coupling the sense node with the digit line. In some examples, aspects of the operations of 625 may be performed by a read component 525 as described with reference to FIG. 5.

An apparatus for performing a method or methods, such as the method 600, is described. The apparatus may include means for charging a sense node of a sense component to a first precharge voltage, the sense node coupled with a first transistor and a second transistor that may be configured to selectively couple the sense node with a voltage source, means for biasing a gate of the first transistor to a first voltage based on charging the sense node to the first precharge voltage, means for charging the sense node to a second precharge voltage different than the first precharge voltage based on biasing the gate of the first transistor to the first voltage, means for coupling the sense node with a digit line associated with a memory cell based on charging the sense node to the second precharge voltage, and means for determining a logic state stored on the memory cell based on coupling the sense node with the digit line.

Another apparatus for performing a method or methods, such as the method 600, is described. The apparatus may include a memory array and a controller in electronic communication with the memory array, where the local memory controller may be operable to charge a sense node of a sense component to a first precharge voltage, the sense node coupled with a first transistor and a second transistor that may be configured to selectively couple the sense node with a voltage source, bias a gate of the first transistor to a first voltage based on charging the sense node to the first precharge voltage, charge the sense node to a second precharge voltage different than the first precharge voltage based on biasing the gate of the first transistor to the first voltage, couple the sense node with a digit line associated with a memory cell based on charging the sense node to the second precharge voltage, and determine a logic state stored on the memory cell based on coupling the sense node with the digit line.

Some examples of the method 600 and apparatuses described herein may further include processes, features, means, or instructions for activating the second transistor to couple the sense node with the voltage source that may be configured to output the first precharge voltage during a first duration of a read operation, where charging the sense node to the first precharge voltage may be based on activating the second transistor. Some examples of the method 600 and apparatuses described herein may further include processes, features, means, or instructions for deactivating the second transistor after the first duration, where biasing the gate of the first transistor to the first voltage may be based on deactivating the second transistor.

Some examples of the method 600 and apparatuses described herein may further include processes, features, means, or instructions for activating the second transistor to couple the sense node with the voltage source that may be configured to output the second precharge voltage during a second duration of a read operation, where charging the sense node to the second precharge voltage may be based on activating the second transistor.

Some examples of the method 600 and apparatuses described herein may further include processes, features, means, or instructions for deactivating the second transistor before coupling the sense node with the digit line based on charging the sense node to the second precharge voltage. Some examples of the method 600 and apparatuses described herein may further include processes, features, means, or instructions for transferring, using the first transistor, a charge between the digit line and the sense node based on coupling the sense node with the digit line, where determining the logic state stored on the memory cell may be based on transferring the charge.

In some examples of the method 600 and apparatuses described herein, the second transistor may be a column select transistor configured to selectively couple an I/O line with the sense node. Some examples of the method 600 and apparatuses described herein may further include processes, features, means, or instructions for activating a third transistor coupled with the sense node and configured to selectively couple the sense node with an I/O line after determining the logic state stored on the memory cell.

Some examples of the method 600 and apparatuses described herein may further include processes, features, means, or instructions for modifying, based on charging the sense node to the first precharge voltage, an output of the voltage source to be a voltage different than the first precharge voltage. In some examples of the method 600 and apparatuses described herein, the second precharge voltage may be greater than the first precharge voltage. In some examples of the method 600 and apparatuses described herein, the first precharge voltage may be greater than the first voltage of the gate of the first transistor. In some examples of the method 600 and apparatuses described herein, the second precharge voltage may be greater than a second voltage of the digit line, the second voltage of the digit line based on the logic state stored on the memory cell.

Figure 7:
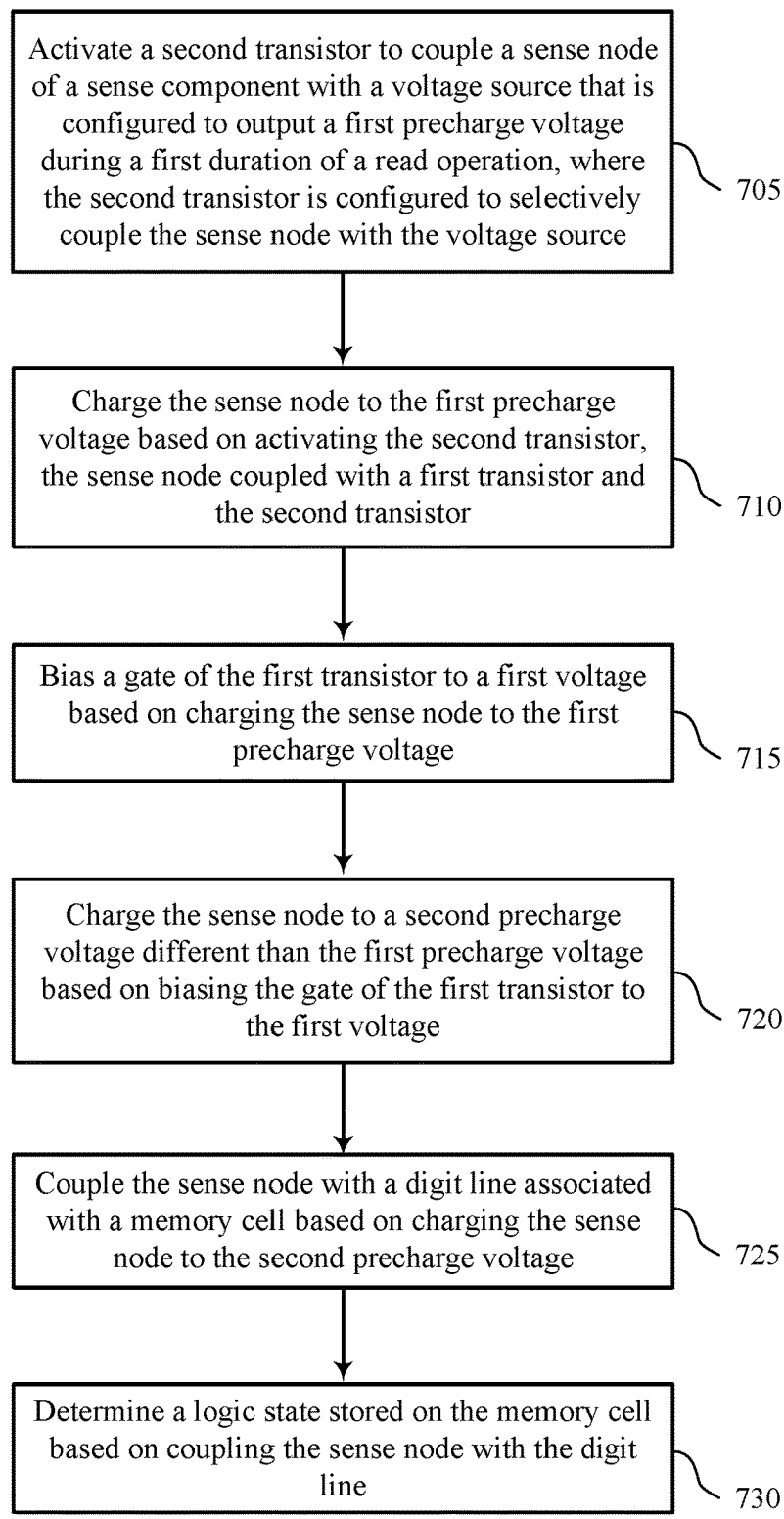

FIG. 7 shows a flowchart illustrating a method 700 that supports techniques for charging a sense component in accordance with aspects of the present disclosure. The operations of method 700 may be implemented by a controller or its components as described herein. For example, the operations of method 700 may be performed by a controller (e.g., device memory controller 155, local memory controller 165, local memory controller 260, as described with reference to FIGS. 1 and 2). In some examples, a controller may execute a set of instructions to control the functional elements of the memory array to perform the functions described herein. Additionally or alternatively, a controller may perform aspects of the functions described herein using special-purpose hardware.

At 705 the controller may activate a second transistor to couple a sense node of a sense component with a voltage source that may be configured to output a first precharge voltage during a first duration of a read operation, where the second transistor may be configured to selectively couple the sense node with the voltage source. In some examples, aspects of the operations of 705 may be performed by a biasing component 515 as described with reference to FIG. 5.

At 710 the controller may charge the sense node to the first precharge voltage based on activating the second transistor, the sense node coupled with a first transistor and the second transistor. In some examples, aspects of the operations of 710 may be performed by a charging component 510 as described with reference to FIG. 5.

At 715 the controller may bias a gate of the first transistor to a first voltage based on charging the sense node to the first precharge voltage. In some examples, aspects of the operations of 715 may be performed by the biasing component 515 as described with reference to FIG. 5.

At 720 the controller may charge the sense node to a second precharge voltage different than the first precharge voltage based on biasing the gate of the first transistor to the first voltage. In some examples, aspects of the operations of 720 may be performed by the charging component 510 as described with reference to FIG. 5.

At 725 the controller may couple the sense node with a digit line associated with a memory cell based on charging the sense node to the second precharge voltage. In some examples, aspects of the operations of 725 may be performed by a transfer component 520 as described with reference to FIG. 5.

At 730 the controller may determine a logic state stored on the memory cell based on coupling the sense node with the digit line. In some examples, aspects of the operations of 730 may be performed by a read component 525 as described with reference to FIG. 5.

An apparatus for performing a method or methods, such as the method 700, is described. The apparatus may include means for activating a second transistor to couple a sense node of a sense component with a voltage source that may be configured to output a first precharge voltage during a first duration of a read operation, where the second transistor may be configured to selectively couple the sense node with the voltage source, means for charging the sense node to the first precharge voltage based on activating the second transistor, the sense node coupled with a first transistor and the second transistor, means for biasing a gate of the first transistor to a first voltage based on charging the sense node to the first precharge voltage, means for charging the sense node to a second precharge voltage different than the first precharge voltage based on biasing the gate of the first transistor to the first voltage, means for coupling the sense node with a digit line associated with a memory cell based on charging the sense node to the second precharge voltage, and means for determining a logic state stored on the memory cell based on coupling the sense node with the digit line.

Another apparatus for performing a method or methods, such as the method 700, is described. The apparatus may include a memory array and a local memory controller in electronic communication with the memory array, where the local memory controller may be operable to activate a second transistor to couple a sense node of a sense component with a voltage source that may be configured to output a first precharge voltage during a first duration of a read operation, where the second transistor may be configured to selectively couple the sense node with the voltage source, charge the sense node to the first precharge voltage based on activating the second transistor, the sense node coupled with a first transistor and the second transistor, bias a gate of the first transistor to a first voltage based on charging the sense node to the first precharge voltage, charge the sense node to a second precharge voltage different than the first precharge voltage based on biasing the gate of the first transistor to the first voltage, couple the sense node with a digit line associated with a memory cell based on charging the sense node to the second precharge voltage, and determine a logic state stored on the memory cell based on coupling the sense node with the digit line.

It should be noted that the methods described herein describe possible implementations, and that the operations and the steps may be rearranged or otherwise modified and that other implementations are possible. Furthermore, aspects from two or more of the methods may be combined.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

As used herein, the term "virtual ground" refers to a node of an electrical circuit that is held at a voltage of approximately zero volts (0V) but that is not directly coupled with ground. Accordingly, the voltage of a virtual ground may temporarily fluctuate and return to approximately 0V at steady state. A virtual ground may be implemented using various electronic circuit elements, such as a voltage divider consisting of operational amplifiers and resistors. Other implementations are also possible. "Virtual grounding" or "virtually grounded" means connected to approximately 0V.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some cases, the flow of signals between the connected components may be interrupted for a time, for example, using one or more intermediate components such as switches or transistors.

The term "coupling" refers to condition of moving from an open-circuit relationship between components in which signals are not presently capable of being communicated between the components over a conductive path to a closed-circuit relationship between components in which signals are capable of being communicated between components over the conductive path. When a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other when the switch is open. When a controller isolates two components, the controller affects a change that prevents signals from flowing between the components using a conductive path that previously permitted signals to flow.

The term "layer" used herein refers to a stratum or sheet of a geometrical structure. each layer may have three dimensions (e.g., height, width, and depth) and may cover at least a portion of a surface. For example, a layer may be a three-dimensional structure where two dimensions are greater than a third, e.g., a thin-film. Layers may include different elements, components, and/or materials. In some cases, one layer may be composed of two or more sublayers. In some of the appended figures, two dimensions of a three-dimensional layer are depicted for purposes of illustration. Those skilled in the art will, however, recognize that the layers are three-dimensional in nature.

As used herein, the term "substantially" means that the modified characteristic (e.g., a verb or adjective modified by the term substantially) need not be absolute but is close enough to achieve the advantages of the characteristic.

The devices discussed herein, including a memory array, may be formed on a semiconductor substrate, such as silicon, germanium, silicon-germanium alloy, gallium arsenide, gallium nitride, etc. In some cases, the substrate is a semiconductor wafer. In other cases, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as an n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described herein can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. A method, comprising:
   charging a sense node of a sense component to a first precharge voltage, the sense node coupled with a first transistor and a second transistor that is configured to selectively couple the sense node with a voltage source;
   biasing a gate of the first transistor to a first voltage based at least in part on charging the sense node to the first precharge voltage;
   charging the sense node to a second precharge voltage different than the first precharge voltage based at least in part on biasing the gate of the first transistor to the first voltage;
   coupling the sense node with a digit line associated with a memory cell based at least in part on charging the sense node to the second precharge voltage; and
   determining a logic state stored on the memory cell based at least in part on coupling the sense node with the digit line.

2. The method of claim 1, further comprising:
   activating the second transistor to couple the sense node with the voltage source that is configured to output the first precharge voltage during a first duration of a read operation, wherein charging the sense node to the first precharge voltage is based at least in part on activating the second transistor.

3. The method of claim 2, further comprising:
   deactivating the second transistor after the first duration, wherein biasing the gate of the first transistor to the first voltage is based at least in part on deactivating the second transistor.

4. The method of claim 1, further comprising:
   activating the second transistor to couple the sense node with the voltage source that is configured to output the second precharge voltage during a second duration of a read operation, wherein charging the sense node to the second precharge voltage is based at least in part on activating the second transistor.

5. The method of claim 4, further comprising:
   deactivating the second transistor before coupling the sense node with the digit line based at least in part on charging the sense node to the second precharge voltage.

6. The method of claim 1, further comprising:
   transferring, using the first transistor, a charge between the digit line and the sense node based at least in part on coupling the sense node with the digit line, wherein determining the logic state stored on the memory cell is based at least in part on transferring the charge.

7. The method of claim 1, wherein:
   the second transistor is a column select transistor configured to selectively couple an input/output (I/O) line with the sense node.

8. The method of claim 1, further comprising:
   activating a third transistor coupled with the sense node and configured to selectively couple the sense node with an input/output (I/O) line after determining the logic state stored on the memory cell.

9. The method of claim 1, further comprising:
   modifying, based at least in part on charging the sense node to the first precharge voltage, an output of the voltage source to be a voltage different than the first precharge voltage.

10. The method of claim 1, wherein the second precharge voltage is greater than the first precharge voltage, and the first precharge voltage is greater than the first voltage of the gate of the first transistor.

11. The method of claim 1, wherein the second precharge voltage is greater than a second voltage of the digit line, the second voltage of the digit line based at least in part on the logic state stored on the memory cell.

12. A memory device, comprising:
    a memory cell coupled with a digit line;
    a sense component configured to determine a logic state stored on the memory cell during a read operation;
    a first transistor coupled with the sense component and configured to transfer a charge between the digit line and the sense component; and
    a second transistor configured to selectively couple the sense component with a voltage source that is configured to precharge the sense component to a first precharge voltage during a first duration of the read operation and to a second precharge voltage during a second duration of the read operation, wherein the second transistor is configured to apply the first precharge voltage and the second precharge voltage to a node of the first transistor during the read operation,
    wherein the first transistor is configured to couple the sense component to the digit line based at least in part on charging the sense node to the second precharge voltage.

13. The memory device of claim 12, wherein the second transistor comprises:
    a p-channel field effect transistor (FET) and is configured to selectively couple the sense component with an input/output (I/O) line that is configured to transfer a signal associated with the logic state of the memory cell based at least in part on determining the logic state stored on the memory cell.

14. The memory device of claim 12, further comprising:
    a third transistor configured to selectively couple the sense component with an input/output (I/O) line that is configured to transfer a signal associated with the logic state of the memory cell based at least in part on determining the logic state stored on the memory cell.

15. The memory device of claim 12, wherein the second transistor comprises an n-channel field effect transistor (FET) and is configured to decouple the sense component from the voltage source during a third duration of the read operation based at least in part on applying the first precharge voltage or the second precharge voltage to the node of the first transistor.

16. The memory device of claim 15, further comprising:
a third transistor that comprises a p-channel field effect transistor (FET) and is configured to selectively couple the sense component with an input/output (I/O) line that is configured to transfer a signal associated with the logic state of the memory cell based at least in part on determining the logic state stored on the memory cell.

17. The memory device of claim 12, wherein:
the second transistor is configured to be activated to charge the sense component to the first precharge voltage after isolating the digit line from the first transistor; and
the second transistor is configured to be deactivated after charging the sense component to the first precharge voltage.

18. The memory device of claim 12, wherein:
the second transistor is configured to be activated to charge the sense component to the second precharge voltage after biasing a gate of the first transistor to a first voltage; and
the second transistor is configured to be deactivated before coupling the digit line with the first transistor.

19. The memory device of claim 12, wherein the voltage source is configured to output a first range of voltages for the first precharge voltage and a second range of voltages for the second precharge voltage.

20. An apparatus, comprising:
a memory cell coupled with a digit line;
a sense component comprising a sense node and configured to determine a logic state stored on the memory cell during a read operation, the sense node coupled with a first transistor and a second transistor that is configured to selectively couple the sense node with a voltage source; and
a controller coupled with the memory cell and the sense component, the controller configured to:
 charge the sense node to a first precharge voltage;
 bias a gate of the first transistor to a first voltage based at least in part on charging the sense node to the first precharge voltage;
 charge the sense node to a second precharge voltage different than the first precharge voltage based at least in part on biasing the gate of the first transistor to the first voltage;
 couple the sense node with the digit line based at least in part on charging the sense node to the second precharge voltage; and
 determine the logic state stored on the memory cell based at least in part on coupling the sense node with the digit line.

* * * * *